(12) United States Patent
Kwon et al.

(10) Patent No.: US 11,016,325 B2
(45) Date of Patent: May 25, 2021

(54) DISPLAY DEVICE

(71) Applicant: SAMSUNG DISPLAY CO., LTD., Yongin-si (KR)

(72) Inventors: Ohjeong Kwon, Hwaseong-si (KR); Seulgee Lee, Seoul (KR); Minju Han, Seoul (KR); Jaejin Lyu, Yongin-si (KR); Suk-Kung Chei, Suwon-si (KR); Duckjong Suh, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 31 days.

(21) Appl. No.: 16/356,197

(22) Filed: Mar. 18, 2019

(65) Prior Publication Data
US 2019/0293990 A1 Sep. 26, 2019

(30) Foreign Application Priority Data

Mar. 21, 2018 (KR) .................. 10-2018-0032893
Jul. 9, 2018 (KR) .................. 10-2018-0079418

(51) Int. Cl.
*G02F 1/1335* (2006.01)
*G02F 1/13357* (2006.01)
(Continued)

(52) U.S. Cl.
CPC .. *G02F 1/133502* (2013.01); *G02F 1/133617* (2013.01); *H01L 27/322* (2013.01);
(Continued)

(58) Field of Classification Search
CPC ......... G02F 1/133502; G02F 1/133617; G02F 2201/121; G02F 2201/123; H01L 27/322;
(Continued)

(56) References Cited

U.S. PATENT DOCUMENTS 8,536,781 B2 9/2013 Lee et al.
9,680,054 B2 6/2017 Coe-Sullivan et al.
(Continued)

FOREIGN PATENT DOCUMENTS

KR 10-1076262 10/2011
KR 10-1481673 B1 1/2015
(Continued)

OTHER PUBLICATIONS

Extended European Search Report dated May 28, 2019 in corresponding EP 19164190.1.

*Primary Examiner* — Charles S Chang
(74) *Attorney, Agent, or Firm* — Lewis Roca Rothgerber Christie LLP

(57) ABSTRACT

A display device including a display layer to provide a first color light, a color control layer on the grayscale display layer and including a transmission filter for transmitting the first color light and a color conversion filter for converting the first color light to another color light, and an optical control layer on the color control layer. The optical control layer includes a metal layer having an absorption coefficient of 3 or more and 3.5 or less in a wavelength range of 530 nm to 570 nm and a first inorganic sub-layer having an absorption coefficient of 0.3 or more and 1 or less in a wavelength range of 530 nm to 570 nm.

28 Claims, 20 Drawing Sheets

(51) Int. Cl.
*H01L 27/32* (2006.01)
*H01L 51/52* (2006.01)

(52) U.S. Cl.
CPC ...... *H01L 51/5281* (2013.01); *H01L 51/5284* (2013.01); *G02F 2201/121* (2013.01); *G02F 2201/123* (2013.01)

(58) Field of Classification Search
CPC ............. H01L 51/5284; H01L 51/5281; H01L 51/5036; H01L 51/5271
USPC .......................................................... 349/116
See application file for complete search history.

(56) References Cited

U.S. PATENT DOCUMENTS

| | | | |
|---|---|---|---|
| 9,698,311 | B2 | 7/2017 | Greco et al. |
| 9,989,806 | B2 | 6/2018 | Lee et al. |
| 2015/0243930 | A1 | 8/2015 | Kim et al. |
| 2016/0049443 | A1 | 2/2016 | Kim et al. |
| 2017/0031205 | A1 | 2/2017 | Lee |
| 2017/0242292 | A1 | 8/2017 | Jeon et al. |
| 2017/0255055 | A1 | 9/2017 | Liang |
| 2017/0307932 | A1 | 10/2017 | Lee et al. |
| 2017/0343853 | A1* | 11/2017 | Lee .................. G02F 1/133514 |
| 2019/0131350 | A1* | 5/2019 | Kwak ................. H01L 51/5271 |

FOREIGN PATENT DOCUMENTS

| | | |
|---|---|---|
| KR | 10-2017-0014755 A | 2/2017 |
| KR | 10-2017-0031613 A | 3/2017 |
| KR | 10-2017-0099026 A | 8/2017 |
| KR | 10-1780725 B1 | 9/2017 |
| KR | 10-2017-0122343 A | 11/2017 |

* cited by examiner

DISPLAY DEVICE

CROSS-REFERENCE TO RELATED APPLICATIONS

Korean Patent Application Nos. 10-2018-0032893, filed on Mar. 21, 2018, and 10-2018-0079418, filed on Jul. 9, 2018, in the Korean Intellectual Property Office, and entitled: "Display Device," is incorporated by reference herein in its entirety.

BACKGROUND

1. Field

The present disclosure relates to a display device, and more particularly, to a display device including an optical control layer on a color control layer.

2. Description of the Related Art

Various types of display devices have been used to provide image information.

In recent years, liquid crystal display devices and organic light emitting diodes, which are applicable to large display devices, have been developed. On the other hand, a light emitter such as a quantum dot is increasingly applied to increase the light efficiency and color reproducibility of a display device. Research on improving the quality of a display device by further increasing light efficiency and reducing the reflectance of external light by the display panel.

SUMMARY

An embodiment may provide a display device including: a display layer to provide a first color light; a color control layer on the display layer and including a transmission filter for transmitting the first color light and a color conversion filter for converting the first color light to another color light; and an optical control layer disposed on the color control layer and including a metal layer having an absorption coefficient of 3 or more to 3.5 or less in a wavelength range of 530 nm to 570 nm and a first inorganic sub-layer having an absorption coefficient of 0.3 or more and 1 or less in a wavelength range of 530 nm to 570 nm.

In an embodiment, the inorganic layer may satisfy Equation 1 below.

$$2Ta = \left(m + \frac{1}{2}\right) \times \frac{2\lambda}{n_1} \qquad \text{[Equation 1]}$$

wherein in Equation 1, $\lambda$ is a wavelength of 530 nm to 570 nm, m is 0 and a natural number, Ta is a thickness of the inorganic layer, and $n_1$ is a refractive index at the $\lambda$ wavelength of the first inorganic sub-layer.

In an embodiment, a thickness of the first inorganic sub-layer may be 10 nm or more to 40 nm or less.

In an embodiment, a refractive index of the first inorganic sub-layer may be 2 or more and 2.5 or less.

In an embodiment, the first inorganic sub-layer may include molybdenum tantalum oxide.

In an embodiment, the inorganic layer may further include a second inorganic sub-layer having an absorption coefficient of 0.001 or more and 0.2 or less in a wavelength range of 530 nm to 570 nm.

In an embodiment, the inorganic layer may satisfy the following Equation 2.

$$2Ta = \left(m + \frac{1}{2}\right) \times \frac{2\lambda}{(n_1 + n_2)} \qquad \text{[Equation 2]}$$

wherein in the above Equation 2, $\lambda$ is a wavelength of 530 nm to 570 nm, m is 0 and a natural number, Ta is a thickness of the inorganic layer IL, $n_1$ is a refractive index of the first inorganic sub-layer Sub-IL1 at the $\lambda$ wavelength, and $n_2$ is a refractive index of the second inorganic sub-layer Sub-IL2 at the $\lambda$ wavelength.

In an embodiment, a difference between the refractive index of the first organic sub-layer and the refractive index of the second inorganic sub-layer may be 0 or more and 0.5 or less.

In an embodiment, the refractive index of the second inorganic sub-layer may be 2 or more and 2.5 or less.

In an embodiment, a thickness of the first inorganic sub-layer may be 9.9 nm or more and 39.9 nm or less, and a thickness of the second inorganic sub-layer may be 0.1 nm or more and 20.0 nm or less.

In an embodiment, the second inorganic sub-layer may include indium zinc oxide.

In an embodiment, the second inorganic sub-layer may be between the metal layer and the first inorganic sub-layer.

In an embodiment, the second inorganic sub-layer may be on the metal layer and the first inorganic sub-layer.

In an embodiment, the metal layer may have a thickness of 5 nm or more and 20 nm or less.

In an embodiment, the metal layer may include silver.

In an embodiment, the color conversion filter may include at least a quantum dot or a quantum rod.

In an embodiment, the display layer may include a first pixel corresponding to the transmission filter, a second pixel corresponding to the color conversion filter, and a third pixel, wherein the color conversion filter may include a first color conversion filter corresponding to the second pixel and converting the first color light to a second color light and a second color conversion filter corresponding to the third pixel and converting the first color light to a third color light, wherein the optical control layer may overlap the first pixel, the second pixel, and the third pixel.

In an embodiment, the display device may further include a band-gap filter disposed on the color control layer, overlapping the second pixel and the third pixel, blocking the first color light, and transmitting the second color light and the third color light.

In an embodiment, the first color light may have a wavelength of 410 nm to 480 nm, the second color light may have a wavelength of 500 nm to 570 nm, and the third color light may have a wavelength of 625 nm to 675 nm.

In an embodiment, the band-gap filter may include a first dye that absorbs light at a wavelength in a range of at least 440 nm to 460 nm.

In an embodiment, the band-gap filter may further include a second dye that absorbs light at a wavelength in a range of at least 580 nm to 600 nm.

In an embodiment, the first pixel, the second pixel, and the third pixel may include a first organic light emitting diode, a second organic light emitting diode, and a third organic light emitting diode, respectively, wherein light emitting layers of the first organic light emitting diode, the second organic light emitting diode, and the third organic light emitting diode may have an integral shape.

In an embodiment, the display device may further include an absorption layer disposed on the optical control layer and absorbing light having a wavelength in a range of at least 580 nm to 600 nm.

In an embodiment, the display device may further include a low reflective index layer disposed on the optical control layer and having a refractive index of 1.1 or more and 1.5 or less.

In an embodiment, a display device includes: a base substrate; first to third pixels disposed on the base substrate and each including an organic light emitting diode for generating a first color light; a sealing member configured to seal the first to third pixels; a color control layer including a transmission filter corresponding to the first pixel and transmitting the first color light, a first color conversion filter corresponding to the second pixel and converting the first color light to a second color light, and a second color conversion filter corresponding to the third pixel and converting the first color light to a third color light and disposed on the first to third pixels; and an optical control layer including a metal layer having an absorption coefficient of 3 or more and 3.5 or less in a wavelength range of 530 nm to 570 nm and an inorganic layer containing a first inorganic sub-layer having an absorption coefficient of 0.3 or more and 1 or less in the wavelength range of 530 nm to 570 nm, on the color control layer, and overlapping the first to third pixels.

In an embodiment, the inorganic layer may further include a second inorganic sub-layer having an absorption coefficient of 0.001 or more and 0.2 or less in a wavelength range of 530 nm to 570 nm.

In an embodiment, the sealing member may include a thin film sealing layer including at least one inorganic film, wherein the color control layer may be on the thin film sealing layer.

In an embodiment, the sealing member may include an encapsulation substrate spaced apart from the first to third pixels, wherein the color control layer and the optical control layer may be on an upper surface or a lower surface of the sealing substrate.

In an embodiment, a display device includes a first base substrate to receive a first color light; a second base substrate spaced apart from the first base substrate; first to third pixels each including a liquid crystal layer, a pixel electrode for forming an electric field in the liquid crystal layer, and a common electrode, and between the first base substrate and the second base substrate, a color control layer including a transmission filter for transmitting the first color light transmitted through the first pixel, a first color conversion filter for converting the first color light transmitted through the second pixel to a second color light, and a second color conversion filter for converting the first color light transmitted through the third pixel to a third color light, and n the first to third pixels; and an optical control layer including a metal layer having an absorption coefficient of 3 or more and 3.5 or less in a wavelength range of 530 nm to 570 nm and an inorganic layer containing a first inorganic sub-layer having an absorption coefficient of 0.3 or more and 1 or less in the wavelength range of 530 nm to 570 nm, on the color control layer, and overlapping the first to third pixels.

In an embodiment, the inorganic layer may further include a second inorganic sub-layer having an absorption coefficient of 0.001 or more and 0.2 or less in a wavelength range of 530 nm to 570 nm.

In an embodiment, the color control layer may be on a lower surface of the second base substrate and the optical control layer may be between the lower surface of the second base substrate and the color control layer.

In an embodiment, the color control layer and the optical control layer may be on an upper surface of the second base substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
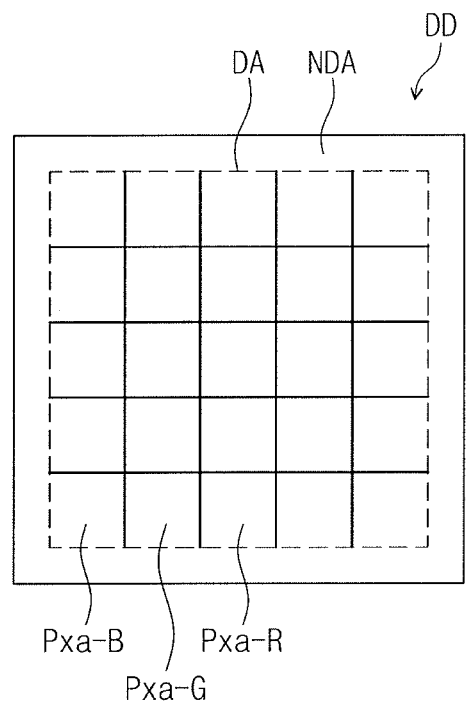
FIG. 1 illustrates a plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Additionally, in various embodiments, the term "include," "comprise," "including," or "comprising," specifies a property, a region, a fixed number, a step, a process, an element and/or a component but does not exclude other properties, regions, fixed numbers, steps, processes, elements and/or components.

Additionally, it will be understood that when a portion such as a layer, a film, an area, and a plate is referred to as being 'on' another portion, it can be directly on the other portion, or an intervening portion can also be present. On the other hand, it will be understood that when a portion such as a layer, a film, an area, and a plate is referred to as being 'below' another portion, it can be directly below the other portion, or an intervening portion can also be present. Also, the term "below" in this specification may include the case where it is disposed at the lower part as well as the upper part.

On the other hand, "directly disposed" in the present application may mean that there is no layer, film, region, plate or the like added between the portion of the layer, film, region, plate or the like and another portion. For example, "directly disposed" may mean disposing without additional members such as adhesive members between two layers or two members.

Hereinafter, a display device according to embodiments will be described with reference to the drawings.

Figure 2:
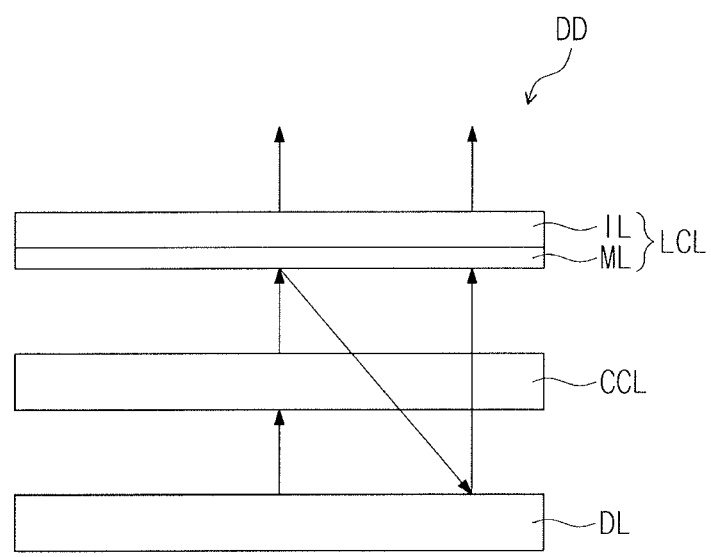
FIG. 2 illustrates a view of paths of light of a display device according to an embodiment.
Figure 3A:
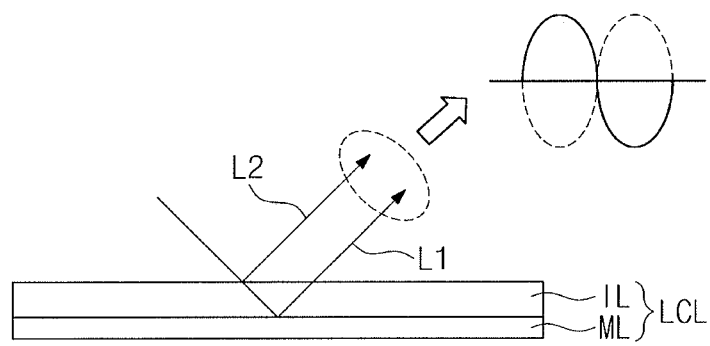
FIGS. 3A and 3B illustrate views of paths of light reflected from an optical control layer according to an embodiment.
Figure 3B:
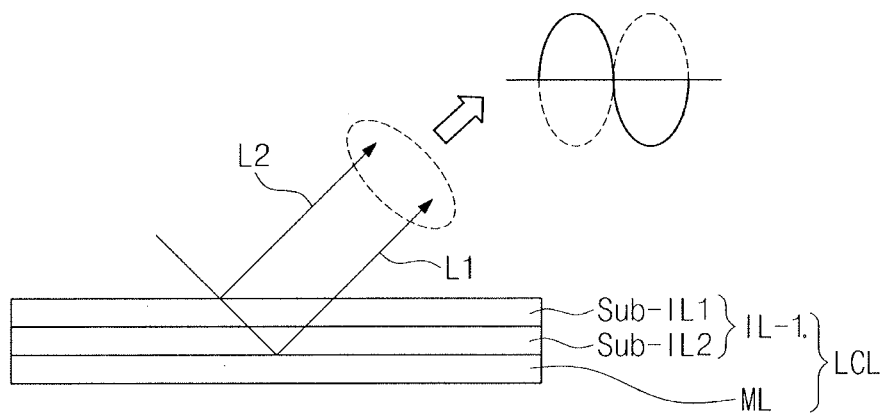

FIG. 1 is a plan view of a display device according to an embodiment. FIG. 2 is a view illustrating paths of light of a display device according to an embodiment. FIGS. 3A and 3B are views illustrating paths of light reflected from an optical control layer according to an embodiment.

Referring to FIG. 1, the display device DD of one embodiment may include a display area DA for displaying an image and a non-display area NDA in which an image is not displayed. The non-display area NDA may be outside, e.g., in a periphery of, the display area DA.

The display area DA may include a plurality of pixel areas Pxa-R, Pxa-G, and Pxa-B. The pixel areas Pxa-R, Pxa-G, and Pxa-B may be defined by, e.g., a plurality of gate lines and a plurality of data lines. The pixel areas Pxa-R, Pxa-G, and Pxa-B may be arranged in a matrix. Each of the pixel areas Pxa-R, Pxa-G, and Pxa-B may include a pixel described later.

The pixel areas Pxa-R, Pxa-G and Pxa-B include a first pixel area Pxa-B for emitting a first color light, a second pixel area Pxa-G for emitting a second color light, and a third pixel area Pxa-R for emitting a third color light. In one embodiment, the first color light may be blue light, the second color light may be green light, and the third color light may be red light. The pixel described below may be an emissive pixel or a transmissive pixel.

In an embodiment, a display device DD having a planar display surface, a curved display surface, or a stereoscopic display surface. The stereoscopic display surface includes a plurality of display areas indicating different directions, and may include, e.g., a polygonal columnar display surface. The display device DD may be a rigid display device or a flexible display device.

As shown in FIG. 2, the display device DD includes a grayscale display layer DL, a color control layer CCL on the grayscale display layer DL, and an optical control layer LCL on the color control layer CCL, e.g., the color control layer CCL may be between the display layer DL and the optical control layer LCL. The optical control layer LCL may include a metal layer ML and an inorganic layer IL, e.g., the metal layer ML may face the color control layer CCL.

Referring to FIG. 2, the grayscale display layer DL provides a first color light to the display device DD. A portion of the first color light may pass through the color control layer CCL. In addition, a portion of the first color light may be converted into another color light by the color control layer CCL. The other color light may be the second color light or the third color light. A portion of the first color light passing through the color control layer CCL may pass through the optical control layer LCL. Another portion of the first color light passing through the color control layer CCL may be reflected at the optical control layer LCL. A portion of the first color light reflected from the optical control layer LCL may be re-reflected by the grayscale display layer DL and re-incident on the color control layer CCL. Therefore, light efficiency of the display device DD may be improved by recycling the light using internal reflection. The other color light generated in the color control layer CCL may pass through the optical control layer LCL.

The optical control layer LCL may include the metal layer ML and the inorganic layer IL to reduce the reflectance of the external light. In one embodiment, the inorganic layer may be a single layer, or a plurality of layers of two or more layers. When the inorganic layer is a single layer, it may contain only one inorganic sub-layer, e.g., only the first inorganic sub-layer, or may include a first inorganic sub-layer, a second inorganic sub-layer, a third inorganic sub-layer, and the like. The lamination structure may be variously arranged. For example, the second inorganic sub-layer may be on the first inorganic sub-layer and the third inorganic sub-layer may be on the second inorganic sub-layer sequentially. Alternatively, the second inorganic sub-layer may be on the third inorganic sub-layer, and the first inorganic sub-layer may be on the second inorganic sub-layer sequentially, and so forth.

In one embodiment, the inorganic layer IL includes a first inorganic sub-layer having an absorption coefficient of 0.3 or more to 1 or less, e.g., between 0.3 and 1, inclusive, in a wavelength range of 530 nm to 570 nm. The inorganic layer IL including the first inorganic sub-layer having an absorption coefficient in the above range may absorb a portion of light incident from the outside, thereby reducing reflection of external light.

As shown in FIGS. 3A and 3B, light of the optical control layer LCL reflected from the metal layer ML and from the inorganic layer IL may be cancel each other out.

In one embodiment, the inorganic layer IL including the first inorganic sub-layer may satisfy the following Equation 1.

$$2Ta = \left(m + \frac{1}{2}\right) \times \frac{2\lambda}{n_1} \qquad \text{[Equation 1]}$$

In Equation 1, λ is a wavelength within a specific wavelength range to be blocked, e.g., a wavelength of 530 nm to 570 nm, and m is 0 or a natural number, and Ta is the thickness of the inorganic layer IL, and m is the refractive index of the first inorganic sub-layer at the λ wavelength.

When the inorganic layer IL satisfies the condition of the above Equation 1, as shown in FIG. 3A, the first light L1 and the second light L2 reflected from the metal layer ML and the inorganic layer IL, respectively, of the optical control layer LCL may be canceled without being reflected to the user due to destructive interference. Thus, the reflection of external light may be effectively reduced.

The inorganic layer IL may simultaneously perform the external light absorbing role and the phase adjusting function for destructive interference. Thus, the optical control layer LCL may effectively reduce the reflection of external light even only using a single inorganic layer.

In one embodiment, the refractive index of the first inorganic sub-layer may be 2 or more to 2.5 or less, e.g., between 2 and 2.5, inclusive. When the refractive index in the above range is satisfied, external light reflected from the metal layer ML may be canceled by destructive interference by satisfying Equation 1, thereby effectively reducing external light reflection.

In one embodiment, the inorganic layer IL may further include a second inorganic sub-layer having an absorption coefficient of 0.001 or more and 0.2 or less, e.g., between 0.001 and 0.2, inclusive, in the wavelength range of 530 nm to 570 nm. The inorganic layer IL further including the second inorganic sub-layer Sub-IL2 having the absorption coefficient in the above range may absorb part of the light incident from the outside, thereby reducing reflection of external light.

In one embodiment, the inorganic layer IL including the first inorganic sub-layer Sub-IL1 and the second inorganic sub-layer Sub-IL2 may satisfy the following Equation 2.

$$2Ta = \left(m + \frac{1}{2}\right) \times \frac{2\lambda}{(n_1 + n_2)} \quad \text{[Equation 2]}$$

In the above Equation 2, $\lambda$ is a wavelength of 530 nm to 570 nm, m is 0 or a natural number, Ta is the thickness of the inorganic layer IL, $n_1$ is the refractive index of the first inorganic sub-layer Sub-IL1 at the $\lambda$ wavelength, and $n_2$ is the refractive index of the second inorganic sub-layer Sub-IL2 at the $\lambda$ wavelength.

When the inorganic layer IL satisfies the condition of Equation 2, as shown in FIG. 3B, the first light L1 and the second light L2' reflected by the metal layer ML and the inorganic layer IL of the optical control layer LCL are cancelled due to destructive interference. Thus, reflection of external light may be effectively reduced.

As shown in FIG. 3B, when the inorganic layer IL includes a plurality of layers, as there is less difference in refractive index, the first inorganic sub-layer Sub-IL1 and the second inorganic sub-layer Sub-IL2 may effectively reduce the external light reflection. For example, the difference in refractive index between the first inorganic layer Sub-IL1 and the second inorganic sub-layer Sub-IL2 may be 0 or more to 0.5 or less, or 0 or more to 0.25 or less, e.g., between 0 and 0.5 or 0 and 0.25, inclusive and the refractive indexes of the first inorganic sub-layer Sub-IL1 and the second inorganic sub-layer Sub-IL2 may be 2 or more and 2.5 or less, e.g., between 2 and 2.5 inclusive.

The thickness of the inorganic layer IL may be within a range of −5% to +5% with respect to the thickness according to Equation 1 if it does not satisfy Equation 1 exactly to still sufficiently reduce external light reflection. For example, the thickness of the inorganic layer IL may be, e.g., 10 nm or more to 40 nm or less, e.g., between 10 nm and 40 nm, inclusive.

As shown in FIG. 3B, when the inorganic layer IL includes the first inorganic sub-layer Sub-IL1 and the second inorganic sub-layer Sub-IL2, the sum of the thickness of the first inorganic sub-layer Sub-IL1 and the thickness of the second inorganic sub-layer Sub-IL2 may be 10.0 nm or more and 40.0 nm or less, e.g., between 10.0 nm and 40.0 nm, inclusive. The thickness of the first inorganic sub-layer Sub-IL1 may be 9.9 nm or more and 39.9 nm or less. e.g., between 9.9 nm to 39.9 nm, inclusive, and the thickness of the second inorganic sub-layer Sub-IL2 may be 0.1 nm or more and 20.0 nm or less, e.g., between 0.1 nm to 20.0 nm, inclusive.

Figure 4:
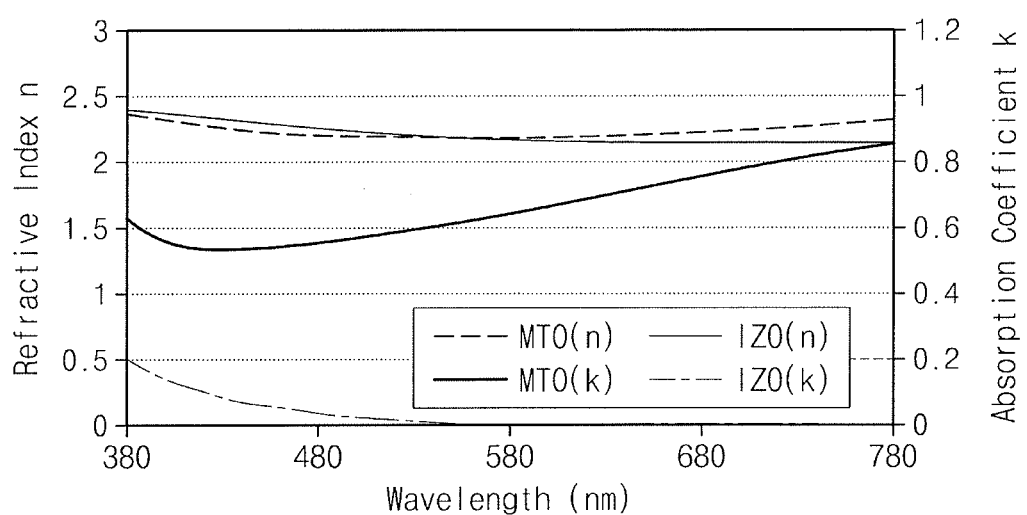
FIG. 4 illustrates a graph of the absorption coefficient and refractive index of an inorganic layer material according to an embodiment.
Figure 5A:
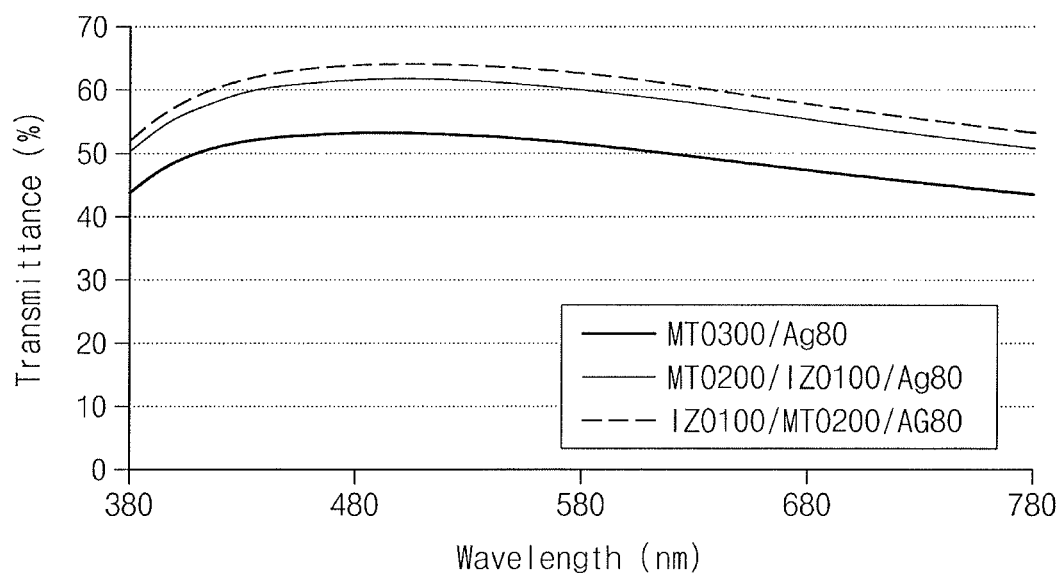
FIGS. 5A and 5B illustrate graphs of the reflectance and transmittance of an optical control layer according to an embodiment.
Figure 5B:
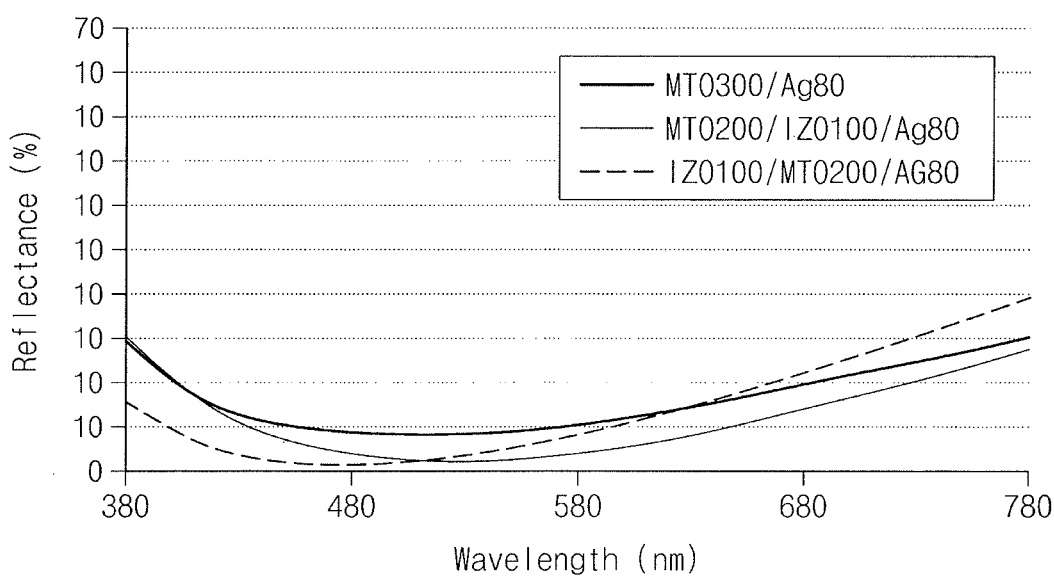

FIG. 4 is a graph showing the absorption coefficient and refractive index of an inorganic layer material according to an embodiment. FIGS. 5A and 5B are graphs showing the reflectance and transmittance of an optical control layer according to an embodiment.

The first inorganic sub-layer Sub-IL1 may include a metal oxide to satisfy the above conditions, and may include, e.g., indium zinc oxide and titanium (IZO/Ti), molybdenum tantalum oxide (MoTaOx), or the like. As shown in FIG. 4, molybdenum tantalum oxide has an absorption coefficient of about 0.61 and a refractive index of about 2.2 at a wavelength of 550 nm.

The second inorganic sub-layer Sub-IL2 may include a metal oxide to satisfy the above conditions, e.g. indium zinc oxide (InZnOx, IZO), or the like. As shown in FIG. 4, indium zinc oxide (IZO) has an absorption coefficient of about 0.01 and a refractive index of about 2.2 at a wavelength of 550 nm.

The metal layer ML has an absorption coefficient of 3 or more to 3.5 or less, e.g., between 3 and 3.5, inclusive, in a wavelength range of 530 nm to 570 nm. When the metal layer ML has an absorption coefficient in the above range, as described with reference to FIG. 2, since a portion of the first color light transmitted to the optical control layer LCL may be recycled and the amount of light absorbed in the metal layer ML may be reduced, the light efficiency of the display device DD may be improved.

The metal layer ML of the optical control layer LCL may be about 5 nm or more to about 20 nm or less thick, e.g., 5 nm to 20 nm, inclusive. When the thickness of the metal layer ML is less than about 5 nm, it is difficult to uniformly form the metal layer ML that thin, and the processability is lowered. Also, the metal layer ML should have a high transmittance, e.g., at least 40 40%. When the thickness of the metal layer ML exceeds about 20 nm, the transmittance of the metal layer ML may be too low.

A metal layer containing silver (Ag), molybdenum (Mo), chromium (Cr), or aluminum (Al) was each formed, and the absorption coefficient k at 550 nm, and the reflectance and transmittance of each metal layer having varying thicknesses were measured at 550 nm. The results are shown in Table 1.

TABLE 1

| Thickness | Ag (k: 3.3) | | Mo (k: 3.7) | | Cr (k: 4.4) | | Al (k: 6.7) | |
| --- | --- | --- | --- | --- | --- | --- | --- | --- |
| | Reflectance | Transmittance | Reflectance | Transmittance | Reflectance | Transmittance | Reflectance | Transmittance |
| 1 nm | 0.7% | 98.8% | 1.9% | 84.6% | 2.3% | 82.4% | 3.5% | 88.8% |
| 5 nm | 6.1% | 91.3% | 12.2% | 48.6% | 15.7% | 43.4% | 35.8% | 44.2% |
| 10 nm | 19.7% | 75.8% | 25.2% | 28.1% | 31.2% | 23.0% | 63.9% | 17.5% |
| 20 nm | 50.7% | 43.1% | 41.6% | 11.7% | 48.8% | 8.2% | 82.9% | 3.4% |
| 30 nm | 72.0% | 21.7% | 47.8% | 5.3% | 54.5% | 3.1% | 87.3% | 0.7% |

Referring to Table 1, as the thickness of the metal layer ML increases, the transmittance decreases, and, as the absorption coefficient increases, the transmittance decreases with respect to the same thickness.

Since the metal layer ML should have a transmittance of 40% or more, the metal layer ML including silver (Ag) may have a thickness range of about 5 nm more to about 20 nm or less, e.g., 5 nm to 20 nm, inclusive. When using molybdenum (Mo), chromium (Cr), or aluminum (Al), the metal layer ML may have a thickness of about 5 nm.

However, when the metal layer ML including molybdenum (Mo), chromium (Cr) or aluminum (Al), when the absorption coefficient is more than 3.5 and the thickness is 5 nm, since the sum of reflectance and transmittance is less than 90%, light loss may occur due to light absorption of the metal layer ML itself. On the other hand, since the metal layer ML including silver (Ag) satisfies an absorption coefficient of 3 or more to 3.5 or less, and the sum of reflectance and transmittance is 90% or more in a total thickness range, the light efficiency may be improved by re-circulating the light due to the internal reflection without causing any optical loss.

FIGS. 5A and 5B are graphs showing a transmittance and reflectance of a multilayer structure in which an optical control layer LCL including an inorganic layer IL having a thickness of 300 Å and a metal layer ML having a thickness of 80 Å and containing silver (Ag). The inorganic layer IL is a monolayer or a plurality of layers including molybdenum oxide (MTO). When the inorganic layer IL is a plurality of layers, the first inorganic sub-layer Sub-IL1 may include molybdenum oxide (MTO) and the second inorganic sub-layer Sub-IL2 may include indium zinc oxide (IZO).

Referring to FIG. 5A, when the optical control layer LCL according to an embodiment has a transmittance of 40% or more at a wavelength of 550 nm, the optical control layer LCL may reduce absorption of light provided by the grayscale display layer DL to further improve the light efficiency.

Comparing using a single layer as the inorganic layer IL and using a plurality of layers as the inorganic layer, by including the second inorganic sub-layer Sub-IL2 having a relatively low absorption coefficient, a thickness of the first inorganic sub-layer Sub-IL1 having a relatively high absorption coefficient may be reduced, so that the transmittance of the optical control layer LCL may be further increased.

Referring to FIG. 5B, the optical control layer LCL according to an embodiment may have a reflectance of 20% or less at a wavelength of 550 nm. If the reflectance of the display device is high, a large amount of external light reflection occurs, and the visibility and readability of the display device become poor. By using an optical control layer LCL whose reflectance is low, external light reflection by the optical control layer LCL is reduced, thereby improving visibility.

Comparing using a single layer as the inorganic layer IL and using a plurality of layers as the inorganic layer IL, even if the thickness of the first inorganic sub-layer Sub-IL1 is reduced in the case of a plurality of layers, since the second inorganic sub-layer Sub-IL2 has a refractive index similar to that of the first inorganic sub-layer Sub-IL1, the reflectance of the optical control layer LCL may be maintained at a level similar to that in the case where the inorganic layer IL is a single layer.

Figure 6:
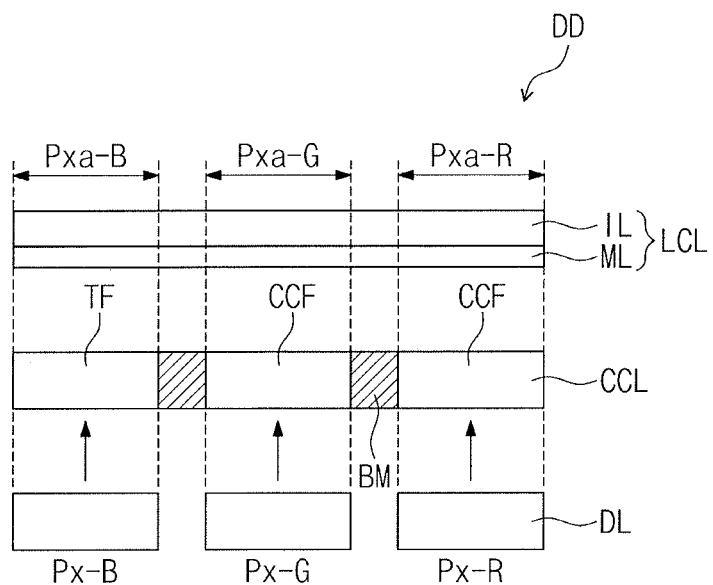
FIG. 6 illustrates a cross-sectional view of a display device according to an embodiment.
Figure 7:
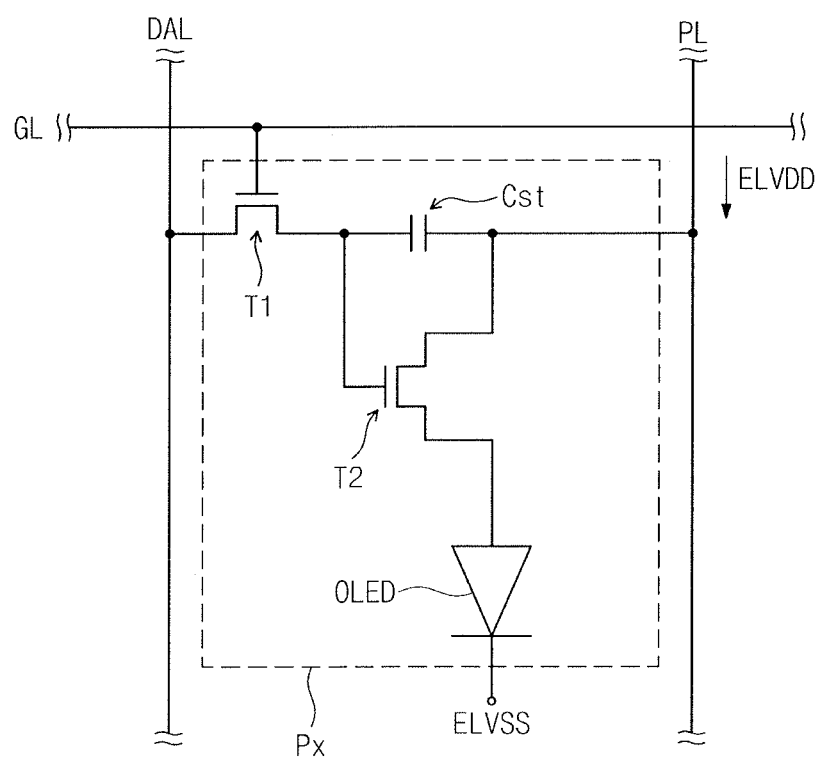
FIG. 7 illustrates an equivalent circuit diagram of a pixel according to an embodiment.
Figure 8:
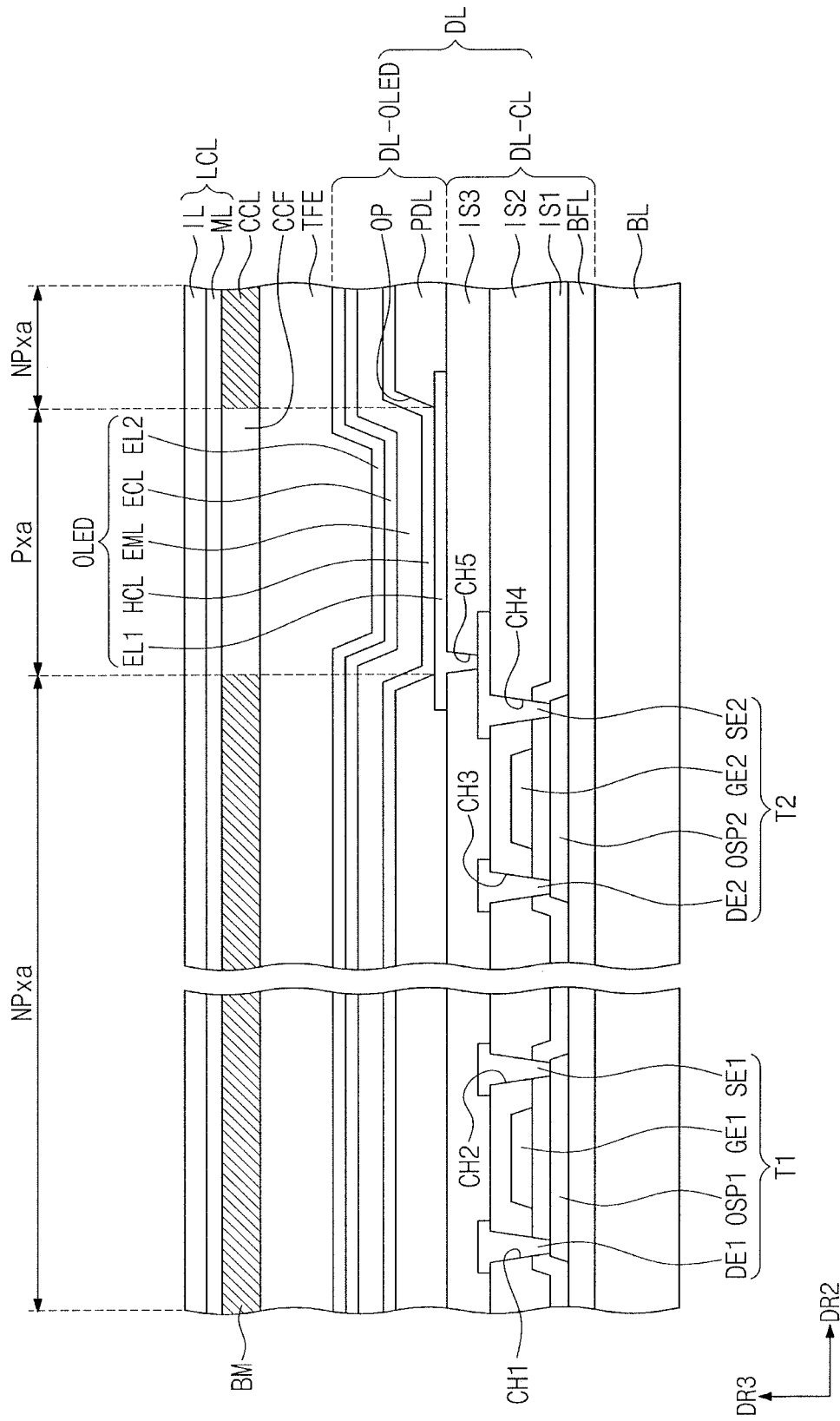
FIG. 8 illustrates a cross-sectional view of a display area of a display device according to an embodiment.
Figure 9A:
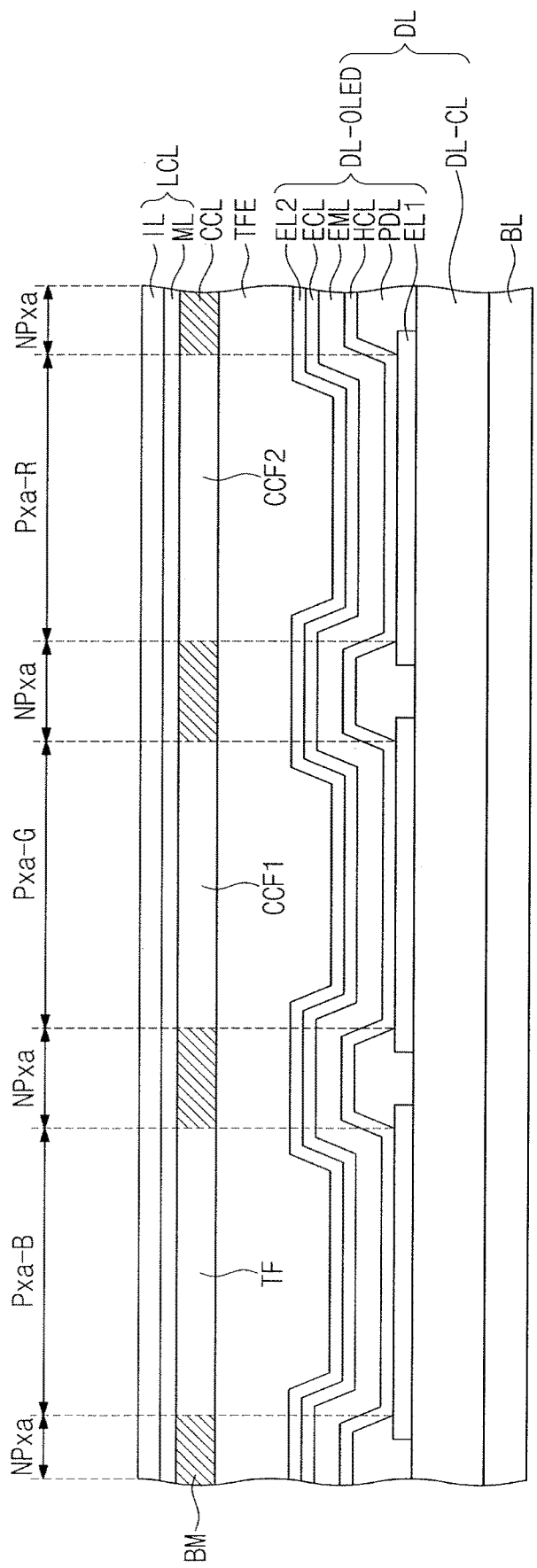
FIGS. 9A to 9C illustrate cross-sectional views of a display device according to an embodiment.
Figure 9B:
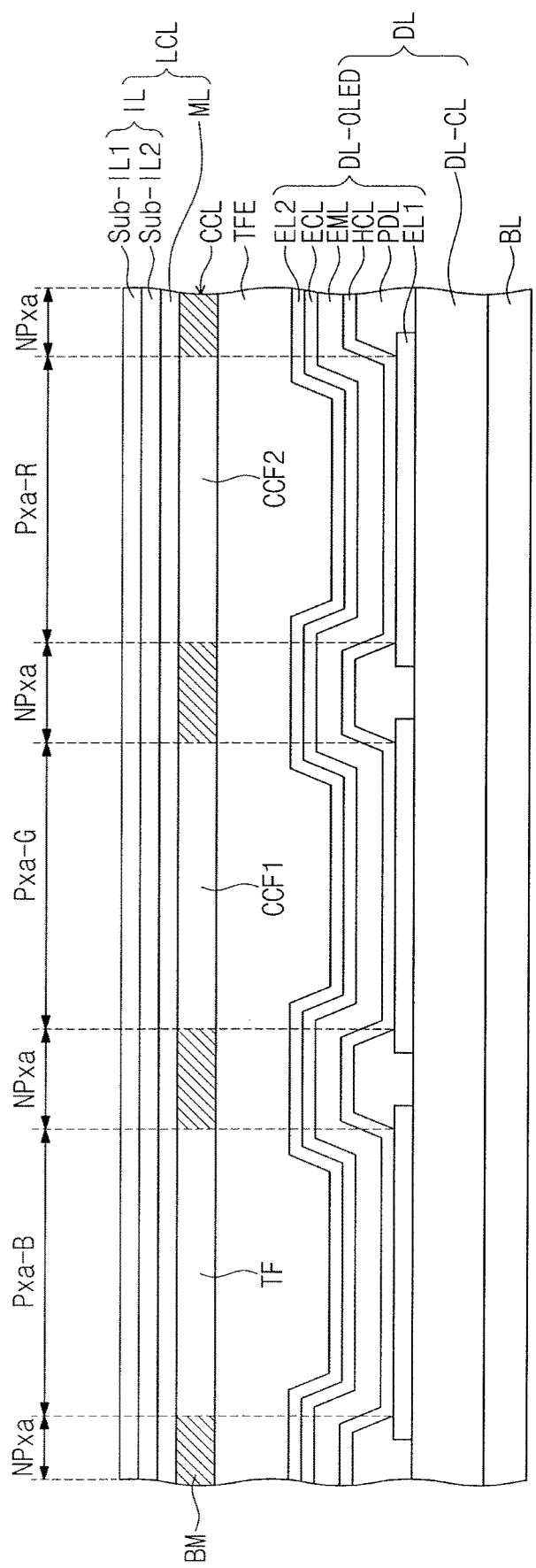
Figure 9C:
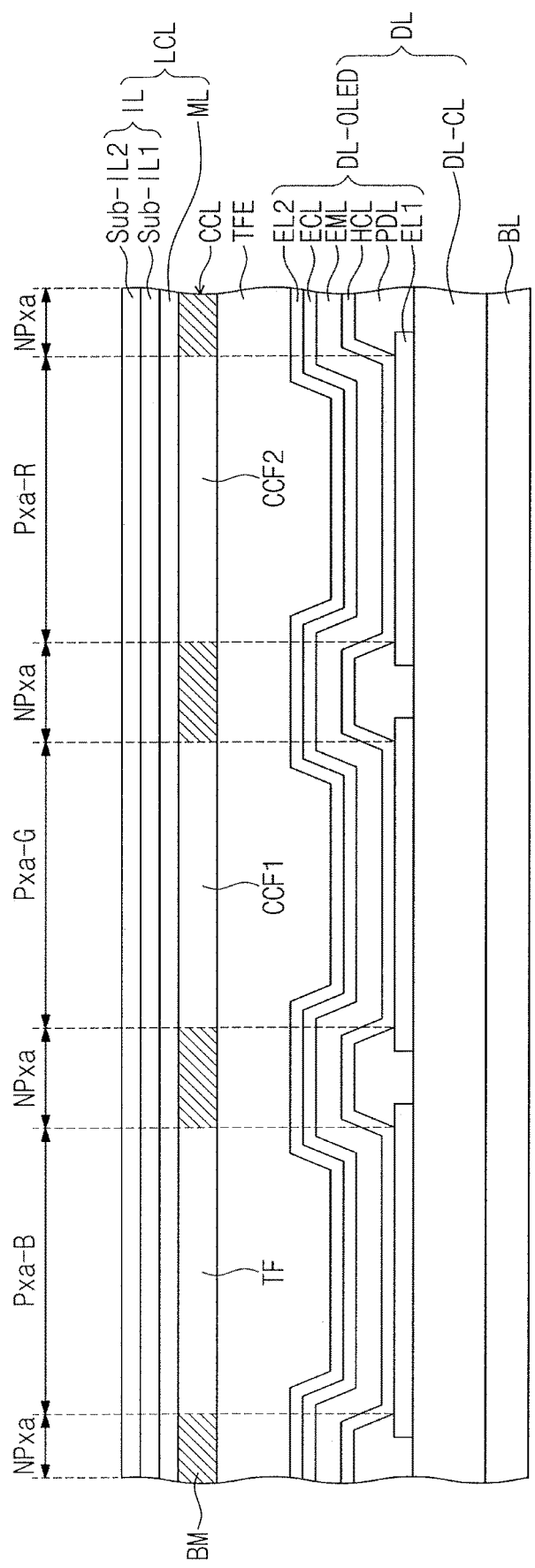

FIG. 6 is a cross-sectional view of a display device according to an embodiment. FIG. 7 is an equivalent circuit diagram of a pixel Px according to an embodiment. FIG. 8 is a cross-sectional view of a display area DA of a display device DD according to an embodiment. FIGS. 9A to 9C are cross-sectional views of a display device according to an embodiment.

Referring to FIG. 6, in one embodiment, the grayscale display layer DL includes a first pixel Px-B, a second pixel Px-G, and a third pixel Px-R corresponding to the first pixel area Pxa-B, the second pixel area Pxa-G, and the third pixel area Pxa-R, respectively. In this embodiment, the first pixel Px-B, the second pixel Px-G, and the third pixel Px-R may have substantially the same configuration. The first pixel Px-B, the second pixel Px-G, and the third pixel Px-R may all provide the same first color light. For example, the first color light may be a blue color light.

The color control layer CCL includes a transmission filter TF and a color conversion filter Tx corresponding to the first pixel area Pxa-B, the second pixel area Pxa-G, and the third pixel area Pxa-R. In this embodiment, a color control layer CCL including one transmission filter TF and two color conversion filters CCFs corresponding to three pixel areas is shown. The transmission filter TF may transmit the first color light and the color conversion filter CCF may convert the first color light to another color light. The other color light may be, e.g., a second color light or a third color light.

In an embodiment, the display device DD may be an organic light emitting display device. A structure in which the grayscale display layer DL, the color control layer CCL, and the optical control layer LCL described with reference to FIGS. 1 to 5 are applied to the organic light emitting display device will be described in detail with reference to FIGS. 7 to 9C.

In FIG. 7, a gate line GL, a data line DAL, a power source line PL, and a pixel Px connected thereto are shown as an example\le. The pixel Px includes a first transistor T1 (or a switching transistor), a second transistor T2 (or a driving transistor), and a capacitor Cst as a pixel driving circuit for driving the display device DD. The first power voltage ELVDD is supplied to the second transistor T2 and the second power voltage ELVSS is supplied to the organic light emitting diode OLED. The second voltage ELVSS may have a lower level than the first voltage ELVDD.

The first transistor T1 outputs a data signal applied to the data line DAL in response to a gate signal applied to the gate line GL. The capacitor Cst charges a voltage corresponding to a data signal received from the first transistor T1. The second transistor T2 is connected to the organic light emitting diode OLED. The second transistor T2 controls a driving current flowing through the organic light emitting diode OLED in correspondence to a charge amount stored in the capacitor Cst.

The pixel Px may further include a plurality of transistors, and may include a larger number of capacitors. The organic light emitting diode OLED may be connected between the power line PL and the second transistor T2.

FIG. 8 shows a cross section corresponding to one pixel. A circuit element layer DL-CL, a display element layer DL-OLED, a sealing member, a color control layer CCL, and an optical control layer LCL are sequentially arranged on a base substrate BL. Although a thin sealing layer TFE is shown as a sealing member in this embodiment, it may be replaced with an encapsulation substrate EAL or the like.

In one embodiment, the base substrate BL may provide a base surface for the grayscale display layer DL. The base substrate BL may be a glass substrate, a metal substrate, or a plastic substrate. The base substrate BL may be, e.g., an inorganic layer, an organic layer, or a composite layer on the substrate.

In one embodiment, the circuit element layer DL-CL includes a buffer layer BFL, e.g., an inorganic layer, a first insulating layer IS1, a second insulating layer IS2, and a third insulating layer IS3. The first insulating layer IS1 and the second insulating layer IS2 may include an inorganic material. The third insulating layer IS3 may include an organic material.

A semiconductor pattern OSP1 (hereinafter referred to as a first semiconductor pattern) of the first transistor T1 and a semiconductor pattern OSP2 (hereinafter referred to as a second semiconductor pattern) of the second transistor T2 are on the buffer layer BFL. The first semiconductor pattern OSP1 and the second semiconductor pattern OSP2 may be amorphous silicon, polysilicon, and metal oxide semiconductors, and the like.

The first insulating layer IS1 may be on the first semiconductor pattern OSP1 and the second semiconductor pattern OSP2. A gate electrode GE1 (hereinafter referred to as a first gate electrode) of the first transistor T1 and a gate electrode GE2 (hereinafter referred to as a second gate electrode) of the second transistor T2 may be on the first insulating layer IS1. The first gate electrode GE1 and the second gate electrode GE2 may be manufactured according to the same photolithography process as the gate lines GGL.

The second insulating layer IS2 covering the first gate electrode GE1 and the second gate electrode GE2 may be on the first insulating layer IS1. A drain electrode DE1 (hereinafter referred to as a first drain electrode) and a source electrode SE1 (hereinafter referred to as a first source electrode) of the first transistor T1 and a drain electrode DE2 (hereinafter referred to as a second drain electrode) and a source electrode SE2 (hereinafter referred to as a second source electrode) of the second transistor T2 are may be on the second insulating layer IS2.

The first drain electrode DE1 and the first source electrode SE1 are electrically connected to the first semiconductor pattern OSP1 through a first through hole CH1 and a second through hole CH2, which pass through the first insulating layer IS1 and the second insulating layer IS2. The second drain electrode DE2 and the second source electrode SE2 are connected to the second semiconductor pattern OSP2 through a third through hole CH3 and a fourth through hole CH4, which pass through the first insulating layer IS1 and the second insulating layer IS2. Alternatively, one or both of the first transistor T1 and the second transistor T2 may have a bottom gate structure.

The third insulating layer IS3 covering the first drain electrode DE1, the second drain electrode DE2, the first source electrode SE1, and the second source electrode SE2 may be on the second insulating layer IS2. The third insulating layer IS3 may provide a flat surface.

A display element layer DL-OLED is on the third insulating layer IS3. The display element layer DL-OLED may include a pixel defining layer PDL and an organic light emitting diode OLED.

The pixel defining layer PDL may include an organic material. An opening part OP is defined in the pixel defining layer PDL. The opening part OP of the pixel defining layer PDL exposes at least a part of the first electrode EL1.

The display area DA may include a pixel area Pxa (or a light emitting area) and a peripheral area NPxa (or a non-light emitting area) adjacent to the pixel area Pxa. The peripheral area NPxa may encompass, e.g., completely surround a periphery of, the pixel area Pxa. In this embodiment, the pixel area Pxa is defined corresponding to a certain area of the first electrode EL1 exposed by the opening part OP.

In an embodiment, the pixel area Pxa may overlap at least one of the first and second transistors T1 and T2. The opening part OP may become wider, and the first electrode EL1 may become wider. In one embodiment, the organic light emitting diode OLED may include a first electrode EL1, a hole control layer HCL, a light emitting layer EML, an electron control layer ECL, and a second electrode EL2, sequentially stacked on the base substrate BL.

The first electrode EL1 is on the third insulating layer IS3. The first electrode EL1 is connected to the second source electrode SE2 through a fifth through hole CH5 passing through the third insulating layer IS3. The first electrode EL1 may be formed of a metal alloy or a conductive compound. The first electrode EL1 may be an anode. The first electrode EL1 may be a transmissive electrode, a semi-transmissive electrode, or a reflective electrode.

The hole control layer HCL may be on the first electrode EL1. The hole control layer HCL may be commonly disposed in the pixel area Pxa and the peripheral area NPxa. The hole control layer HCL may be commonly formed in the pixel area Pxa and the peripheral area NPxa. The hole control layer HCL may have a single layer made of a single material, a single layer made of a plurality of different materials, or a multi-layered structure having a plurality of layers made of a plurality of different materials. For example, the hole control layer HCL may have a single layer structure of a hole injection layer or a hole transport layer, or may have a single layer structure of a hole injection material and a hole transport material. The hole control layer HCL may have a structure of a single layer made of a plurality of different materials or may have a structure of a hole injection layer/a hole transport layer, a hole injection layer/a hole transport layer/a hole buffer layer, a hole injection layer/a hole buffer layer, a hole transport layer/a hole buffer layer, or a hole injection layer/a hole transport layer/an electron blocking layer, which are sequentially stacked from the first electrode EL1. The hole control layer HCL of one embodiment may further include at least one of a hole buffer layer and an electron blocking layer in addition to the hole injection layer and the hole transport layer.

The light emitting layer EML is on the hole control layer HCL. The light emitting layer EML may be commonly disposed in the pixel area Pxa and the peripheral area NPxa. The light emitting layer EML may generate the first color light, e.g., blue light.

In one embodiment, the light emitting layer may be a single layer of a blue light emitting layer. Further, the light emitting layer EML may have a multi-layer structure called a tandem. For example, it may be a two-layer tandem structure, e.g., a blue light emitting layer/a blue light emitting layer, a blue light emitting layer/a yellow light emitting layer, or a blue light emitting layer/a green light emitting layer, and may be a three-layer tandem structure, e.g., a blue light emitting layer/a blue light emitting layer/a blue light emitting layer, a blue light emitting layer/a yellow light emitting layer/a blue light emitting layer, or a blue light emitting layer/a green light emitting layer/a blue light emitting layer. In addition, a charge generation layer may be between the light emitting layers.

The electron control layer ECL is on the light emitting layer EML. The electron control layer ECL may include at least one of a hole blocking layer, an electron transport layer, and an electron injection layer. The electron control layer ECL may have a single layer made of a single material, a single layer made of a plurality of different materials, or a multi-layered structure having a plurality of layers made of a plurality of different materials. For example, the electron control layer ECL may have a single layer structure of an electron injection layer or an electron transport layer, or may have a single layer structure of an electron injection material and an electron transport material. In addition, the electron control layer ECL may have a structure of a single layer made of a plurality of different materials, or may have a structure of an electron transport layer/an electron injection layer, a hole blocking layer/an electron transport layer.

The second electrode EL2 may be on the electron control layer ECL. The second electrode EL2 may be commonly disposed in the pixel areas Pxa. The second electrode EL2 has conductivity. The second electrode EL2 may be formed of a metal alloy or a conductive compound. The second electrode EL2 may be a cathode. The second electrode EL2 may be a transmissive electrode, a semi-transmissive electrode, or a reflective electrode.

A sealing member, e.g., an encapsulation substrate, may be on the second electrode EL2. The encapsulation substrate protects the display element layer DL-OLED from contaminants, e.g., moisture, oxygen, and dust particles. Referring to FIG. 7, the thin film sealing layer TFE may serve as a sealing member. The thin film sealing layer TFE is commonly disposed in the pixel areas Pxa and the peripheral area NPxa. The thin film sealing layer TFE directly covers the second electrode EL2. The thin film sealing layer TFE may include at least one inorganic film. The thin film sealing layer TFE may further include an organic film, or may have a structure in which an inorganic film and an organic layer are alternately repeated. In one embodiment, the inorganic layer may include an inorganic material such as aluminum oxide or silicon nitride, and the organic film may include an acrylate-based organic material. The inorganic film may be formed through a vapor deposition method or the like, and the organic film may be formed through a vapor deposition method, a coating method, or the like.

In one embodiment, a capping layer covering the second electrode EL2 may be between the thin film sealing layer TFE and the second electrode EL2. The thin film sealing layer TFE may directly cover the capping layer. The thin film sealing layer TFE, the electron control layer ECL, and the hole control layer HCL of the display device DD may extend into a non-display area NDA.

In one embodiment, the organic light emitting diode OLED may further include a resonance structure for controlling the resonance distance of the light generated in the light emitting layer EML. The resonance structure may be between the first electrode EL1 and the second electrode EL2. The thickness of the resonance structure may be determined according to the wavelength of the light generated in the light emitting layer EML.

In one embodiment, the circuit element layer DL-CL and the display element layer DL-OLED of FIG. 8 correspond to the grayscale display layer DL of FIG. 2.

The color control layer CCL may be on the thin film sealing layer TFE. The color control layer CCL may include a color conversion filter CCF and a light blocking portion BM. The color conversion filter CCF may be superimposed on the organic light emitting diode OLED.

The light blocking portion BM may be a black matrix. The black blocking portion BM may be formed by including an organic light-shielding material or an inorganic light-shielding material including a black pigment or a dye. The light blocking portion BM may overlap the peripheral area NPxa. The light blocking portion BM may prevent light leakage and distinguish the boundary between the adjacent transmission filter TF and the color conversion filters CCF. The light blocking portion BM may be omitted, and the color conversion filter CCF may be directly on the display layer DL.

FIGS. 9A to 9C show three pixel areas Pxa-R, Pxa-G, and Pxa-B corresponding to FIG. 4. In FIGS. 9A to 9C, the circuit element layer DL-CL in FIG. 7 is schematically shown compared to FIG. 8.

Referring to FIGS. 9A to 9C, the light emitting layer EML overlaps the first to third pixel areas Pxa-R, Pxa-G, and Pxa-B, and has an integral formation. The light emitting layer EML may provide the same first color light. In one embodiment, the first color light may be blue light having a wavelength of 410 nm to 480 nm.

The thin film sealing layer TFE may be on the second electrode. The thin film sealing layer TFE may be commonly disposed in the first to third pixel areas Pxa-R, Pxa-G, and Pxa-B to seal the first to third pixels. The thin film sealing layer TFE protects the organic light emitting diode OLEDs from moisture/oxygen and protects the organic light emitting diodes OLED from foreign substances such as dust particles.

The color control layer CCL may be on the thin film sealing layer TFE. The color control layer CCL may be commonly disposed in the first to third pixel areas Pxa-R, Pxa-G, and Pxa-B.

The light blocking portion BM may be between the transmission filter TF and the first color conversion filter CCF1 and between the first color conversion filter CCF1 and the second color conversion filter CCF2, which are spaced apart from each other. Moreover, although not shown in FIG. 8, at least a portion of the light blocking portion BM may be disposed overlapping the adjacent transmission filter TF or the color conversion filters CCF1 and CCF2.

The transmission filter TF may correspond to the first pixel area Pxa-B. The transmission filter TF does not include a light emitter and may transmit the first color light. The transmission filter TF may include a transparent polymer resin, and may further include at least one of a blue pigment and a dye to improve color purity.

The first color conversion filter CCF1 may include a first light emitter disposed corresponding to the second pixel area Pxa-G and absorbing the first color light and converting the first color light to the second color light. The second color light may be, e.g., green light having a wavelength of 500 nm to 570 nm.

The second color conversion filter CCF2 may include a second light emitter disposed corresponding to the third pixel area Pxa-R and absorbing the first color light and converting the first color light to the third color light. The third color light may be, e.g., red light having a wavelength of 625 nm to 675 nm.

The first light emitter and the second light emitter may include at least a Quantum Dot or a Quantum Rod. The quantum dot and the quantum rod may be Group II-VI compounds, Group III-V compounds, Group IV-VI compounds, Group IV elements, Group IV compounds, and combinations thereof.

The Group II-VI compound may be selected from bivalent element compounds, e.g., CdSe, CdTe, ZnS, ZnSe, ZnTe, ZnO, HgS, HgSe, HgTe, MgSe, MgS, and compounds thereof; trivalent element compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnSe, MgZnSe, MgZnS, and compounds thereof; and tetravalent element, e.g., HgZnTeS, CdZnSeS, CdZnSeTe, CdZnSTe, CdHgSeS, CdHgSeTe, CdHgSTe, HgZnSeS, HgZnSeTe, HgZnSTe, and compounds thereof.

The Group III-V compound may be bivalent element compounds, e.g., GaN, GaP, GaAs, GaSb, AlN, AlP, AlAs, AlSb, InN, InP, InAs, InSb, and compounds thereof; trivalent element compounds, e.g., GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and compounds thereof; and tetravalent element compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and compounds thereof. The Group IV-VI compound may be selected from bivalent element compounds, e.g., SnS, SnSe, SnTe, PbS, PbSe, PbTe, and compounds thereof; trivalent element compounds, e.g., SnSeS, SnSeTe, SnSTe, PbSeS, PbSeTe, PbSTe, SnPbS, SnPbSe, SnPbTe, and compounds thereof; and tetravalent element compounds, e.g., SnPbSSe, SnPbSeTe, SnPbSTe, and compounds thereof. The Group IV elements may be, e.g., Si, Ge, and compounds thereof. The Group IV group compound may be a bivalent element, e.g., SiC, SiGe, and compounds thereof.

The bivalent element compound, the trivalent element compound, or the tetravalent element compound may be present in the particle at a uniform concentration, or may be present in the same particle by dividing the concentration distribution to a partially different state.

The quantum dot may be a core shell structure including a core and a shell surrounding the core. Also, one quantum dot may have a core/shell structure surrounding other quantum dots. The interface between the core and the shell may have a concentration gradient that is lowered as the concentration of the element in the shell approaches the center.

The quantum dot may be a particle having a nanometer scale size. The quantum dot may have a full width of half maximum (FWHM) of the emission wavelength spectrum of about 45 nm or less, about 40 nm or less, or about 30 nm or less. In this range, color purity and color reproducibility may be improved. Further, since light emitted through the quantum dots is emitted in all directions, a wide viewing angle may be improved. The shape of the quantum dots may be any commonly used in the art, e.g., spherical, pyramidal, multi-arm or cubic nanoparticles, nanotubes, nanowires, nanofibers, nano platelike particles, and the like.

Unlike the quantum dot having a spherical structure, the quantum rod has a crystal structure formed of any one of hexagonal, wurtzite, and Zinc blende. The quantum rod grows in the uniaxial direction, has a rod shape, and emits light of a different wavelength depending on its size.

The quantum rod may be a core shell structure including a core and a shell surrounding the core. In addition, the quantum rod is distinguished by organic ligands to aid dispersion. Since the quantum rod has a very high extinction coefficient and excellent quantum yields compared to conventional dyes, it may generate strong fluorescence and may adjust the wavelength of visible light by altering the diameter of the quantum rod. In addition, the quantum rod emits linearly polarized light and can adjust luminescence by separating electrons and holes when an external electric field is applied by the stark effect. Therefore, use of quantum rods may improve the light efficiency of the display device.

The quantum dot and the quantum rod may change the color of light emitted according to a particle size. Accordingly, the particle sizes of the quantum dot or quantum rod of the first light emitter and the second light emitter may be different from each other. For example, the particle size of the quantum dot or quantum rod of the first light emitter may be smaller than the particle size of the quantum dot or quantum rod of the second light emitter. At this time, the quantum dot or quantum rod of the first light emitter may emit light of a shorter wavelength than the quantum dot or quantum rod of the second light emitter.

Also, the transmission filter TF and the color conversion filters CCF1 and CCF2 may further include a polymer resin, scattering particles, and the like.

Referring to FIGS. 9A to 9C, since the optical control layer LCL may have a transmittance of 40% or more, may overlap the pixel areas Pxa-R, Pxa-G, and Pxa-B and the peripheral area NPxa. In addition, the optical control layer LCL may overlap the display area DA and the non-display area NDA as a whole. Therefore, since the optical control layer LCL does not undergo a separate patterning process in the manufacturing process and does not need to fabricate a separate mask for patterning, the processibility is excellent and the productivity is excellent because the manufacturing cost is reduced.

In addition, since the optical control layer LCL includes an inorganic layer IL and a metal layer ML having a specific range of absorption coefficient in a wavelength range of 530 nm to 570 nm, it may have a relatively high transmittance in the wavelength range of 530 nm to 570 nm compared to other wavelength ranges. Since the first color conversion filter CCF1, which includes the quantum dot or quantum rod emitting green light, has a lower light efficiency than the second color conversion filter CCF2 including the quantum dot or quantum rod emitting red light, when the optical control layer LCL having a relatively high transmittance in a wavelength range of 530 nm to 570 nm is included, the reduction of the light efficiency of the green light may be minimized.

Referring to FIG. 9B, the inorganic layer IL includes a first inorganic sub-layer Sub-IL1 and a second inorganic sub-layer Sub-IL2, and the second inorganic sub-layer Sub-IL2 may be between the metal layer ML and the first sub-inorganic layer (Sub-IL1).

Referring to FIG. 9C, the inorganic layer IL-2 includes a first inorganic sub-layer Sub-IL1 and a second inorganic sub-layer Sub-IL2, and the second inorganic sub-layer Sub-IL2 may be on the metal layer ML and the first inorganic sub-layer Sub-IL1. In order to effectively reduce external light reflection for improving visibility, when it is necessary to adjust the color coordinates of the reflected light, the color coordinates of the light reflected by arranging the second inorganic sub-layer Sub-IL2 having a relatively small absorption coefficient on the metal layer ML and the first inorganic sub-layer Sub-IL1 may be adjusted.

FIGS. 10A to 10D are cross-sectional views of a display device DD according to an embodiment. Hereinafter, detailed description of the same configuration as that described with reference to FIGS. 1 to 9C will be omitted.

Figure 10A:
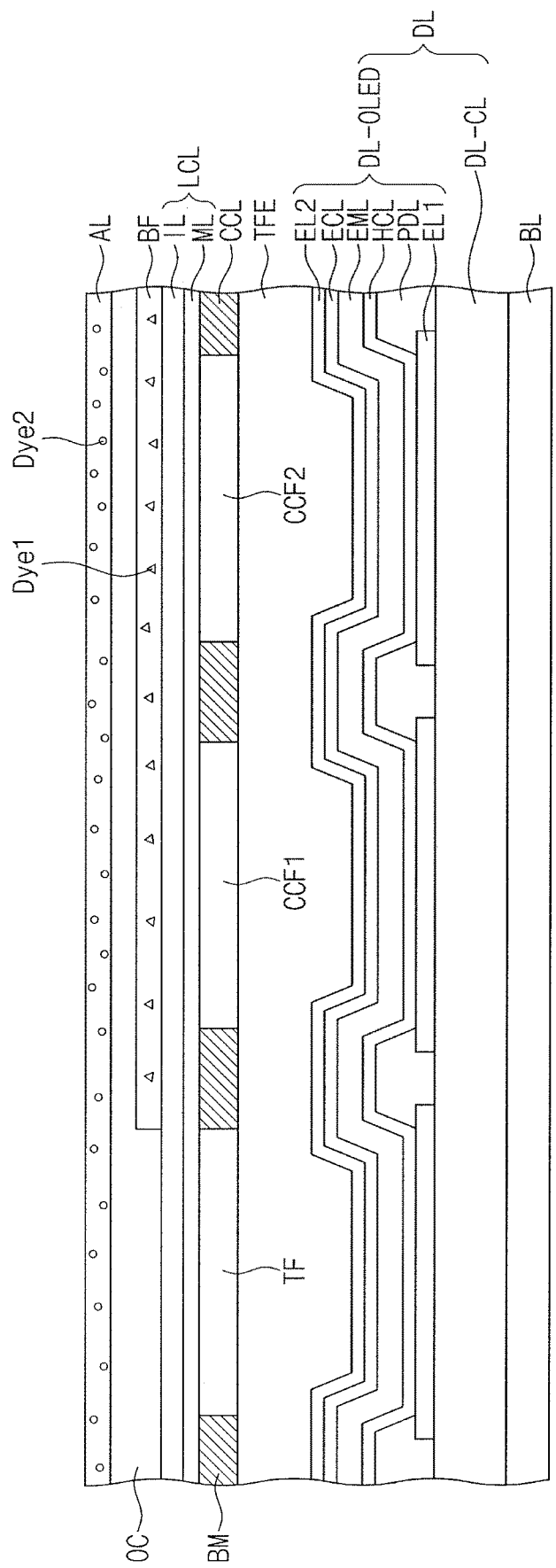
FIGS. 10A to 10D illustrate cross-sectional views of a display device according to an embodiment.
Figure 10B:
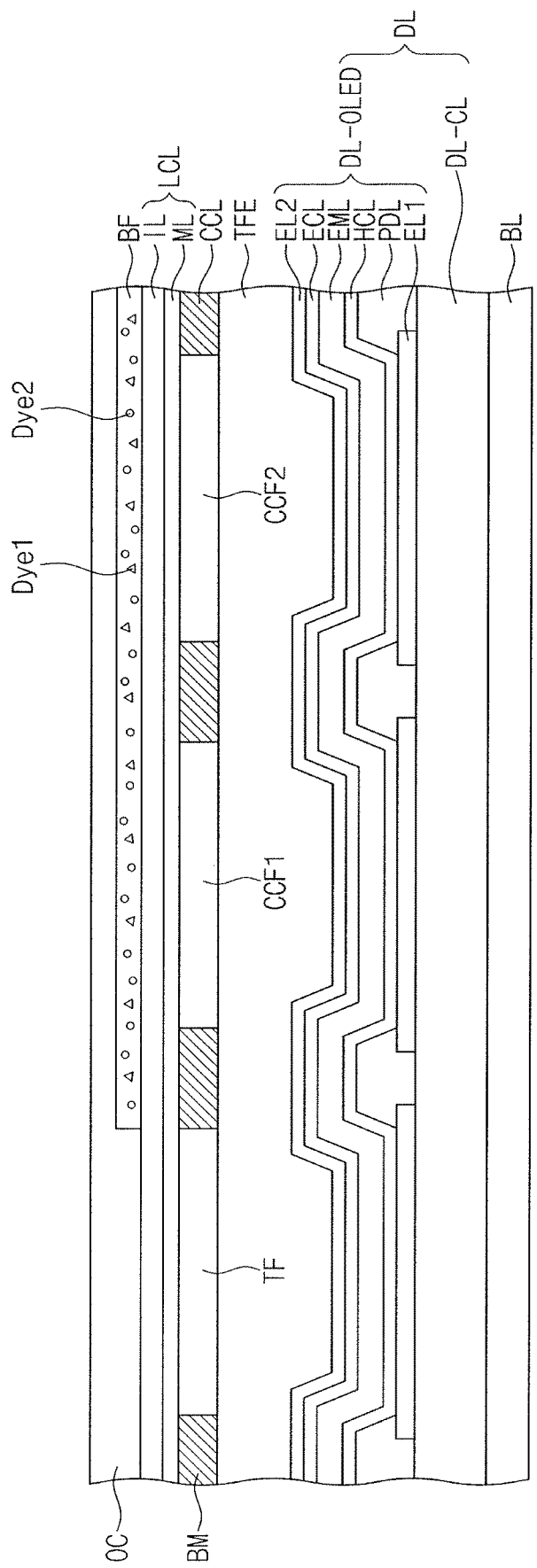

As shown in FIGS. 10A and 10B, in one embodiment, the display device DD may further include a band-pass filter BF. The band-pass filter BF may be on, e.g., directly on, the optical control layer LCL. The band-pass filter BF may overlap the second pixel and the third pixel. The band-pass filter BF may block the first color light, and transmit the second color light and the third color light. The band-pass filter BF may include one layer or a plurality of stacked layers. For example, the band-pass filter BF may be a single layer including a material that absorbs blue light, or may be a multi-layered structure in which a low-refractive index layer and a high-refractive index layer are stacked.

The band-pass filter BF may include a pigment or a dye to block the first color light. Referring to FIG. 10A, in one embodiment, the band-gap filter BF may include a first dye Dye1. The first dye Dye1 may absorb light having a wavelength of 450 nm and light having a wavelength of at least 440 nm to 460 nm. Alternatively, the first dye Dye1 may absorb light at a wavelength of 400 nm to 480 nm while having a maximum absorption rate of light at a wavelength of 450 nm.

Referring to FIG. 10B, the band-gap filter BF may further include another dye to block light of a specific wavelength. In one embodiment, the band-gap filter BF may include a second dye Dye2. The second dye Dye2 absorbs light of a wavelength of 590 nm and light of a wavelength of at least 580 nm to 600 nm. Alternatively, the second dye Dye2 may absorb light at a wavelength of 550 nm to 630 nm while having a maximum absorption rate of light at a wavelength of 590 nm.

In one embodiment, the display device DD further includes a planarization layer OC. The planarization layer OC may be between the color control layer CCL and the band-gap filter BF or between the optical control layer LCL and the band-gap filter BF to provide a flat surface.

Figure 10C:
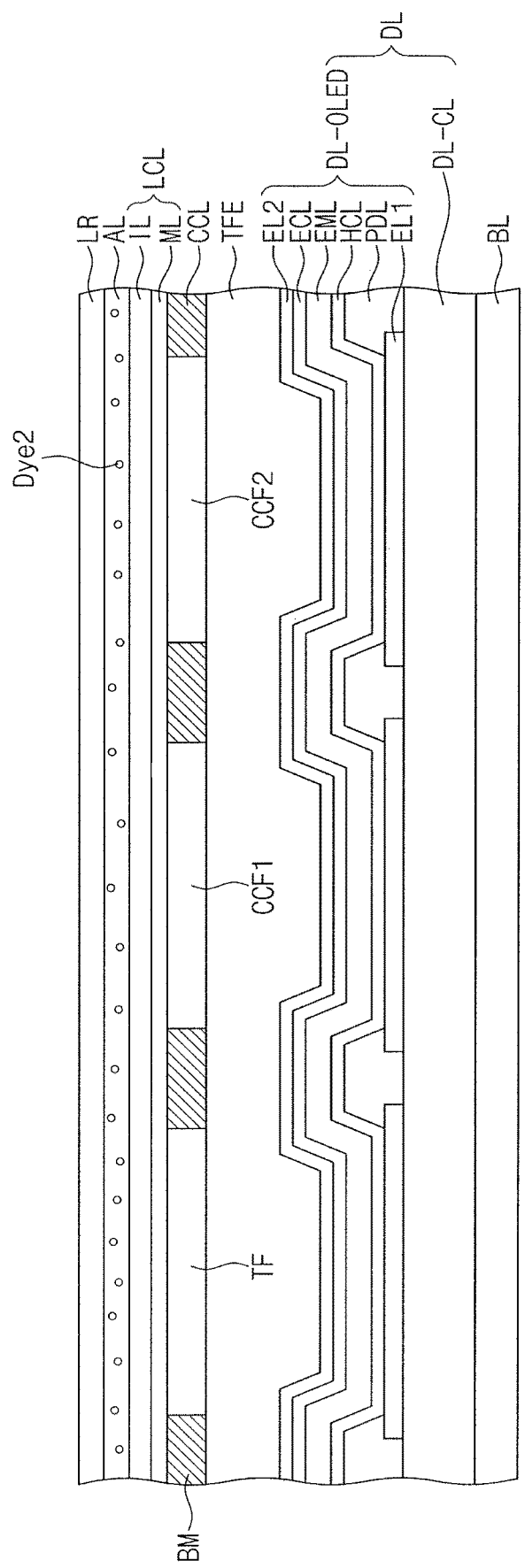
Figure 10D:
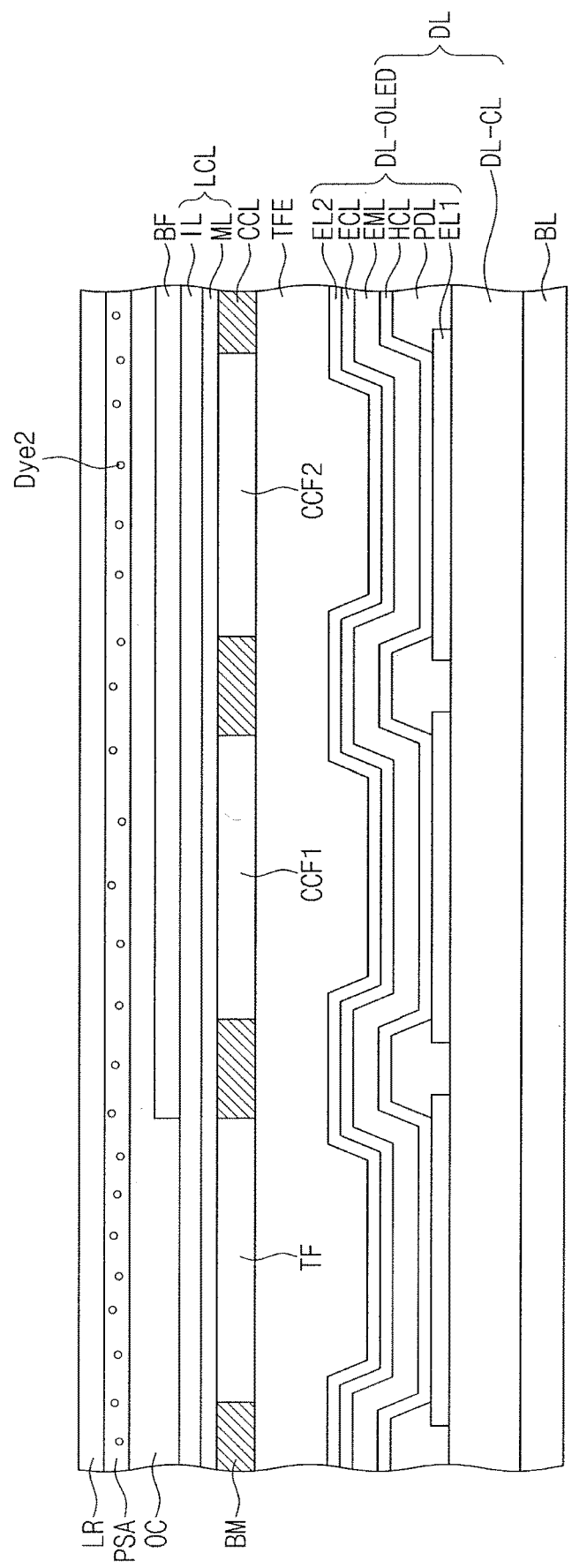

As shown in FIGS. 10C and 10D, in one embodiment, the display device DD may further include a low refractive index layer LR. The low reflective index layer LR may have a refractive index of 1.1 or more and 1.5 or less, e.g., between 1.1 and 1.5, inclusive. When refractive index of the low reflective index layer LR is in the above range, the low reflective index layer LR may totally reflect a portion of the first color light escaping from the color control layer CCL by Snell's law and allow it to be re-incident to the color control layer CCL. The display device DD according may improve the light efficiency by re-circulating the light using internal reflection.

The low reflective index layer LR may include a material having a refractive index of 1.1 or more and 1.5 or less or 1.2 or more to 1.3 or less, e.g., between 1.1 and 1.5, inclusive, or between 1.2 and 1.3, inclusive. For example, the low reflective index layer LR may include porous particles including hollow silica, Aerosel, or pores. Specifically, the porous particles may be inorganic particles or organic particles, and may be particles including a large number of irregular pores.

The low reflective index layer LR may be on the optical control layer LCL. In one embodiment, as shown in FIG. 10C, the low reflective index layer LR may be on an absorption layer AL on the optical control layer LCL. Alternatively, the low reflective layer may be directly on the optical control layer LCL. Further alternatively, as shown in FIG. 10D, the low reflective index layer LR may be on the optical control layer LCL via an adhesive layer PSA. Referring to FIG. 10D, in one embodiment, the adhesive layer PSA may include a second dye Dye2 to block light in the 550 nm to 630 nm wavelength range.

As shown in FIGS. 10A and 10C, the display device DD may further include an absorption layer AL. The absorption layer AL may be on the optical control layer LCL. The absorption layer AL may include a second dye Dye2 to block light in the 550 nm to 630 nm wavelength range.

Figure 11:
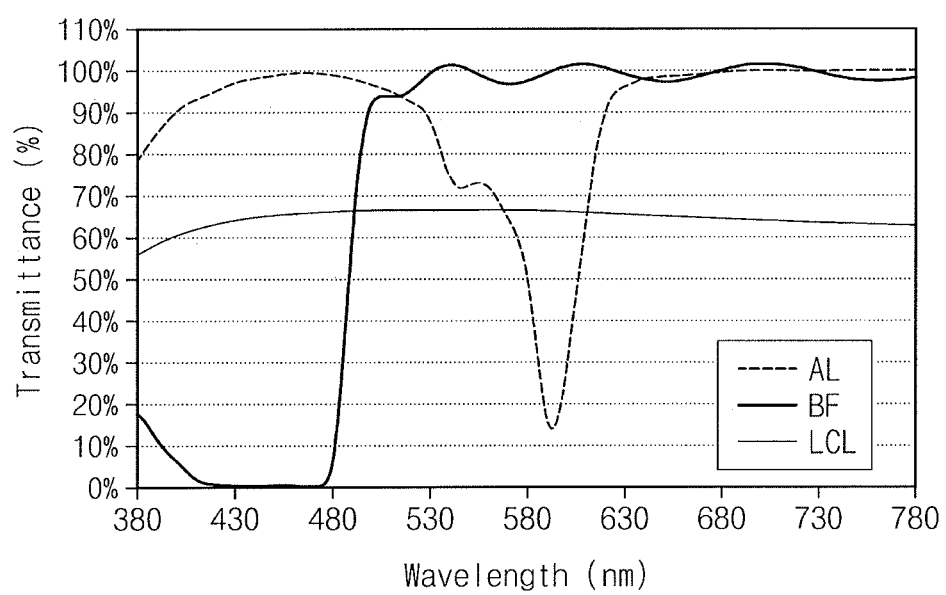
FIG. 11 illustrates a graph showing the transmittance of each layer according to an embodiment.

FIG. 11 is a graph of measuring the transmittance of each of an optical control layer LCL, a band-gap filter BF including a first dye Dye1, and an absorption layer AL including a second dye Dye2 in a wavelength range of 380 nm to 780 nm according to an embodiment. Since an optical control layer LCL made of a metal layer including silver (Ag) and an inorganic layer including molybdenum tantalum oxide (MoTaOx) has a light transmittance of 50% or more in the above wavelength range, light emitted from the color control layer CCL may be effectively transmitted. Since the band-gap filter BF hardly transmits light having a wavelength of 400 nm to 480 nm, blue light is effectively blocked. Since the absorption layer AL has a minimum transmittance at 590 nm, light of 590 nm is effectively blocked.

The band-gap filter BF, the absorption layer AL, the low reflective index layer LR, and the adhesive layer PSA may be additionally included or omitted in the display device DD, and may be disposed on the optical control layer LCL in various orders besides those shown in FIGS. 10A to 10D.

Figure 12:
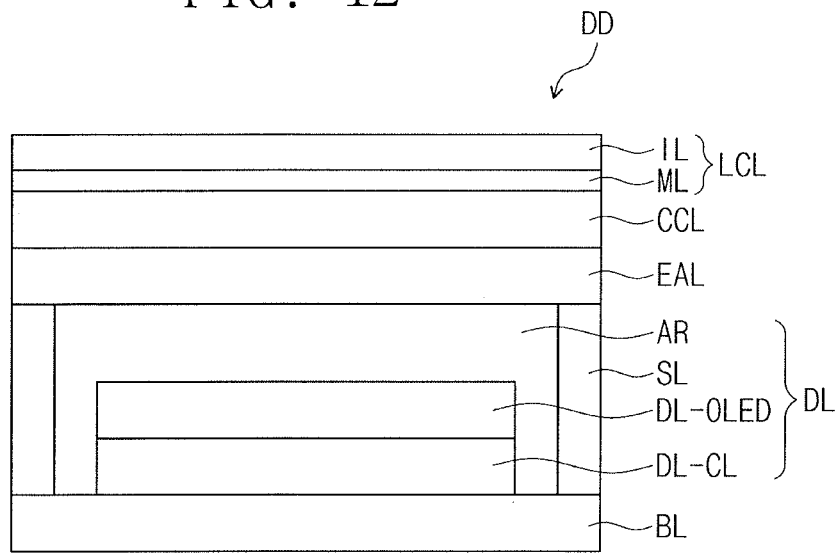
FIG. 12 illustrates a cross-sectional view of a display device according to an embodiment.
Figure 13:
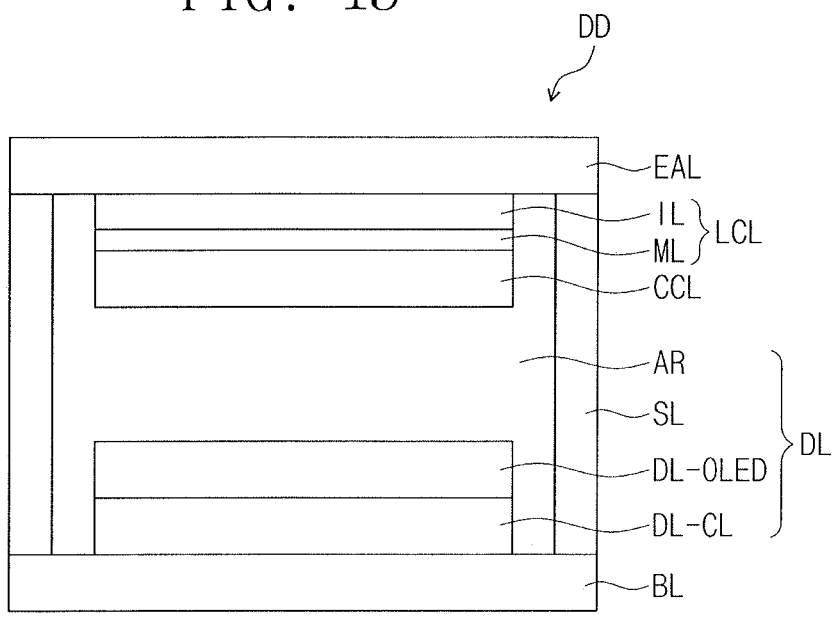
FIG. 13 illustrates a cross-sectional view of a display device according to an embodiment.
Figure 14:
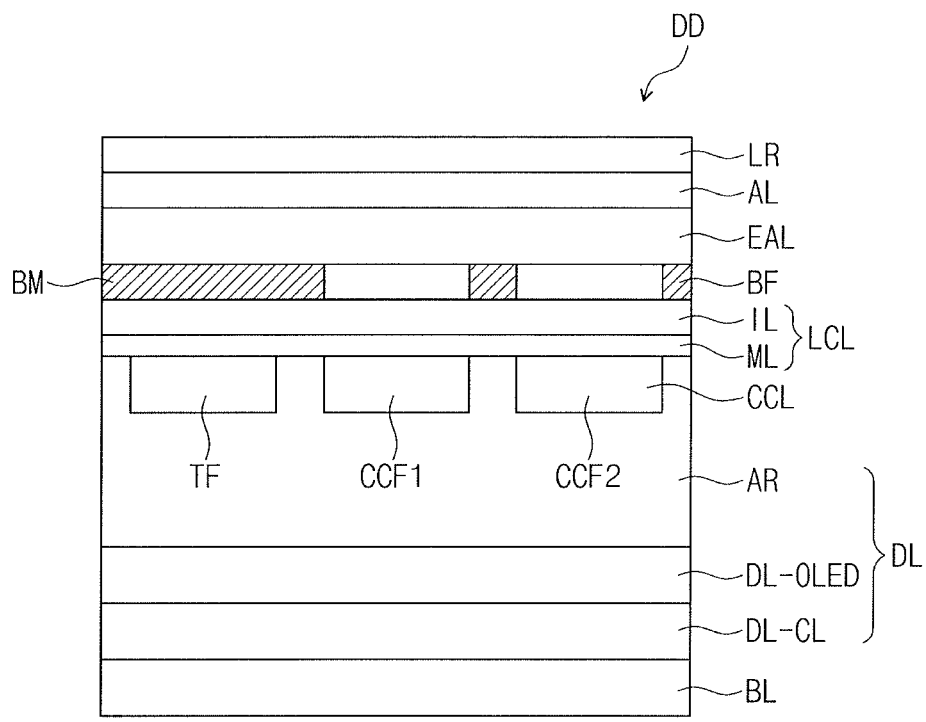
FIG. 14 illustrates a cross-sectional view of a display device according to an embodiment.

FIGS. 12 to 14 are cross-sectional views of a display device according to an embodiment. Hereinafter, a detailed description of the same components as those of the display device described with reference to FIGS. 1 to 11 will be omitted.

The display device DD according to the present embodiment may include an encapsulation substrate EAL as a sealing member. The encapsulation substrate EAL may be coupled to the base substrate BL by a sealing member SL along the edge on a plane, e.g., may extend along a stacking direction between the base substrate BL and the encapsulation substrate EAL.

Referring to FIGS. 12 to 13, the encapsulation substrate EAL may be on the base substrate BL and may cover the display area DA. The encapsulation substrate EAL may be a substrate made of glass or plastic. The sealing member SL may include a sealant, e.g., a glass frit. The sealing member SL may prevent the organic light emitting diode OLED from being exposed to the external moisture and air together with the encapsulation substrate EAL.

The sealing member SL has a predetermined thickness along the stacking direction between the base substrate BL and the encapsulation substrate EAL. Therefore, the inner space AR is formed by the base substrate BL, the encapsulation substrate EAL, and the sealing member SL. The inner space AR may be formed in vacuum, filled with nitrogen ($N_2$), or filled with an insulating material. The organic light emitting diode DL-OLED and the circuit element layer DL-CL may be in contact with one or both sides of the sealing member SL.

As shown in FIG. 12, the color control layer CCL and the optical control layer LCL may be on the upper surface of the encapsulation substrate EAL, e.g., a surface opposite a lower surface facing base substrate BL. Additionally, a band-gap filter BF, an absorption layer AL, and/or a low reflective index layer LR may be further on the optical control layer LCL.

As shown in FIG. 13, the optical control layer LCL and the color control layer CCL may be on the lower surface of the encapsulation substrate EAL. The optical control layer LCL may be between the encapsulation substrate EAL and the color control layer CCL. Additionally, a band-gap filter BF, an absorption layer AL, and/or a low reflective index layer LR may be on the optical control layer LCL.

As shown in FIG. 10A, when the display device DD further includes a band-gap filter BF and an absorption layer AL, the band-gap filter BF and the absorption layer AL may be between the encapsulation substrate EAL and the optical control layer LCL. Alternatively, the band-gap filter BF may be between the encapsulation substrate EAL and the optical control layer LCL, and the absorption layer AL may be on the upper surface of the encapsulation substrate EAL. Alternatively, the band-gap filter BF and the absorption layer AL may be on the upper surface of the encapsulation substrate EAL.

As shown in FIG. 10C, when the display device DD further includes an absorption layer AL and a low reflective index layer LR, the absorption layer AL and the low reflective index layer LR may be disposed between the encapsulation substrate EAL and the optical control layer LCL. Alternatively, the absorption layer AL may be between the encapsulation substrate EAL and the optical control layer LCL, and the low reflective index layer LR may be on the upper surface of the encapsulation substrate EAL. Alternatively, the absorption layer AL and the low reflective index layer LR may be on the upper surface of the encapsulation substrate EAL.

FIG. 14 is a cross-sectional view of a display device according to an embodiment. FIG. 14 shows a display device DD including an encapsulation substrate EAL. Referring to FIG. 14, an absorption layer AL and a low reflective index layer LR are on the upper surface of the encapsulation substrate EAL. A band-gap filter BF, an optical control layer LCL, and a color control layer CCL are sequentially on the lower surface of the encapsulation substrate EAL. The band-gap filter BF may include a light blocking portion BM. In relation to the color control layer CCL, the transmission filter TF, the first color conversion filter CCF1, and the second color conversion filter CCF2 may be spaced apart from each other without the light blocking portion BM.

Figure 15:
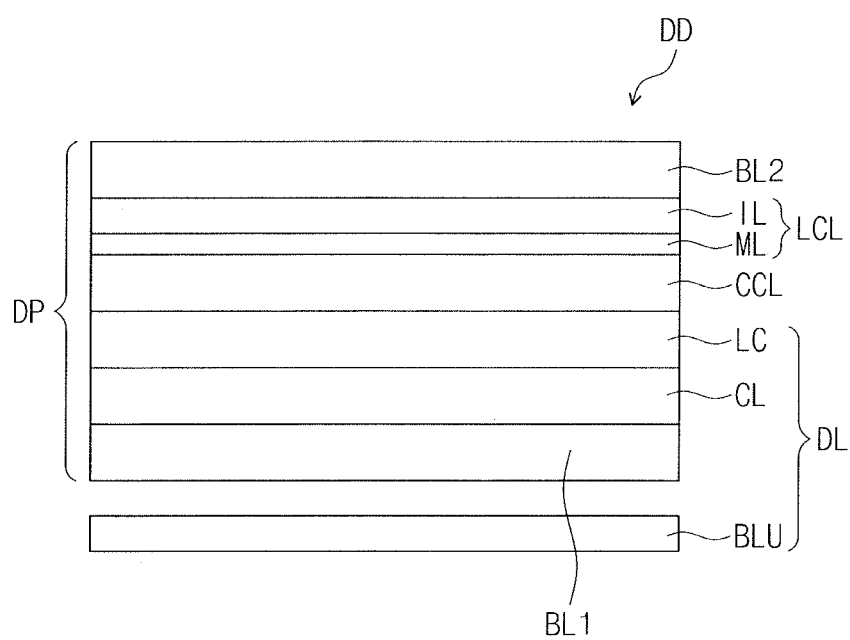
FIG. 15 illustrates a cross-sectional view of a display device according to an embodiment.
Figure 16A:
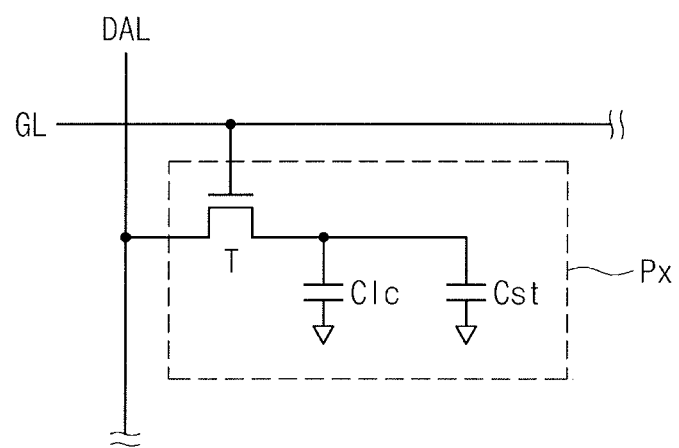
FIG. 16A illustrates an equivalent circuit diagram of a pixel according to an embodiment.
Figure 16B:
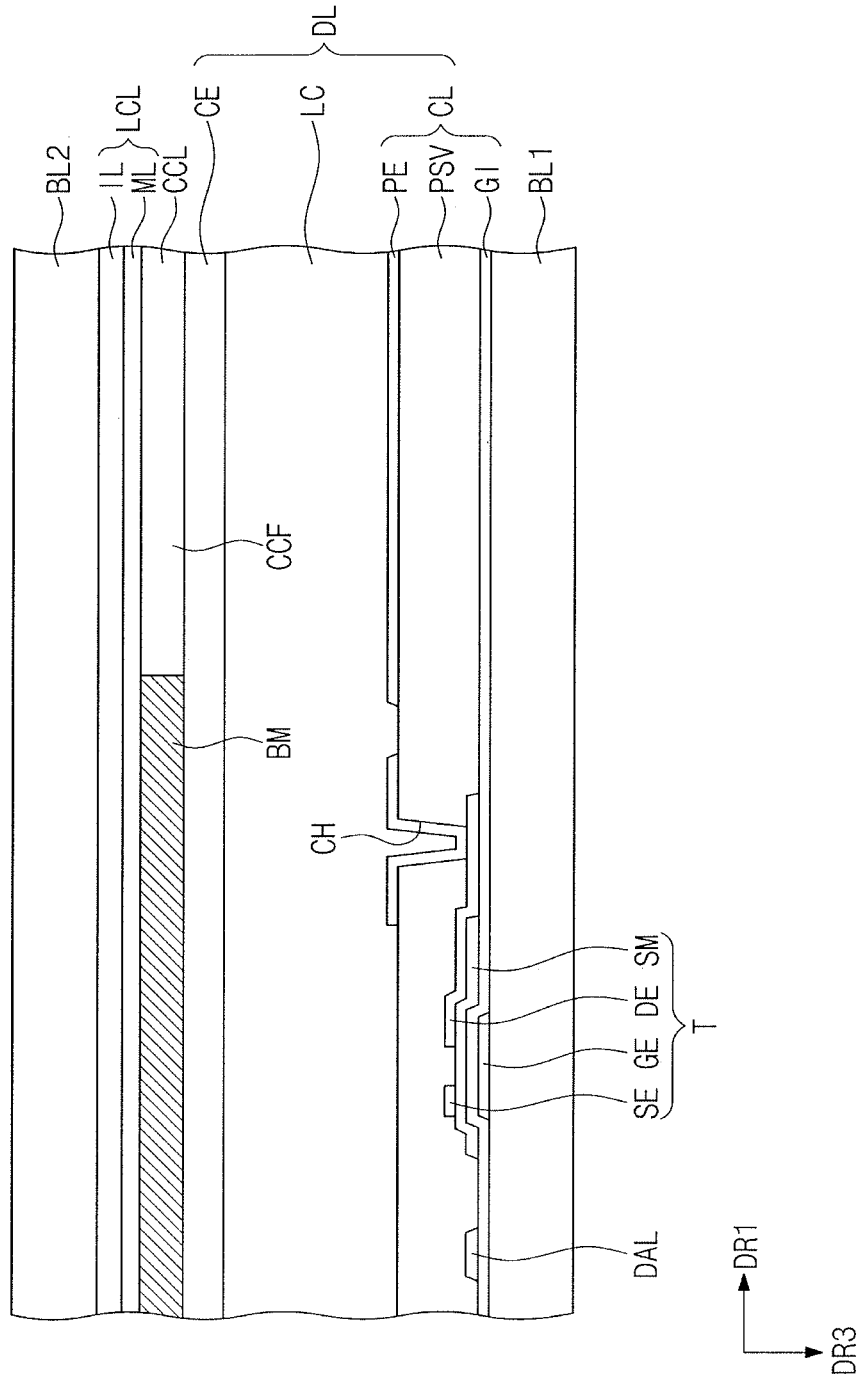
FIG. 16B illustrates a cross-sectional view of a display panel according to an embodiment.
Figure 17A:
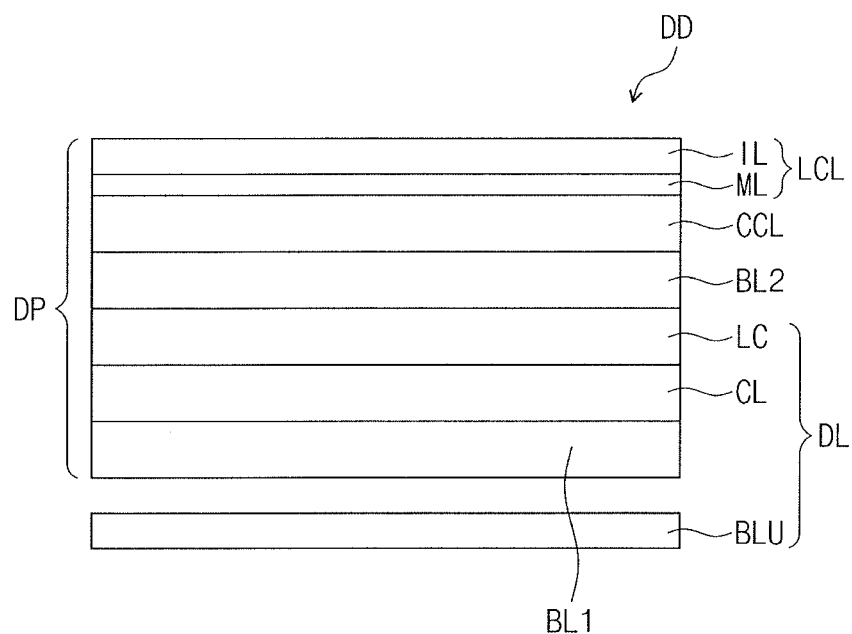
FIGS. 17A to 17C illustrate cross-sectional views of a display device according to an embodiment.
Figure 17B:
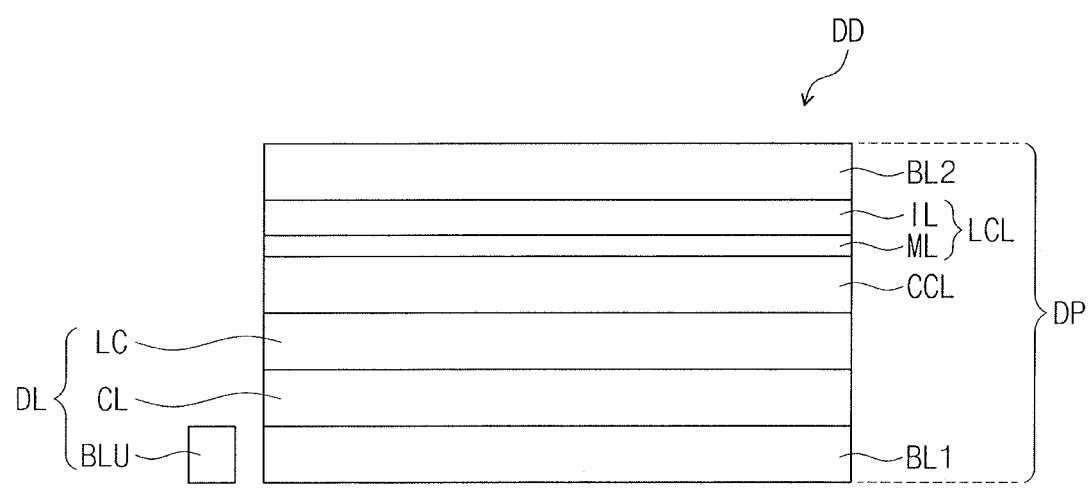
Figure 17C:
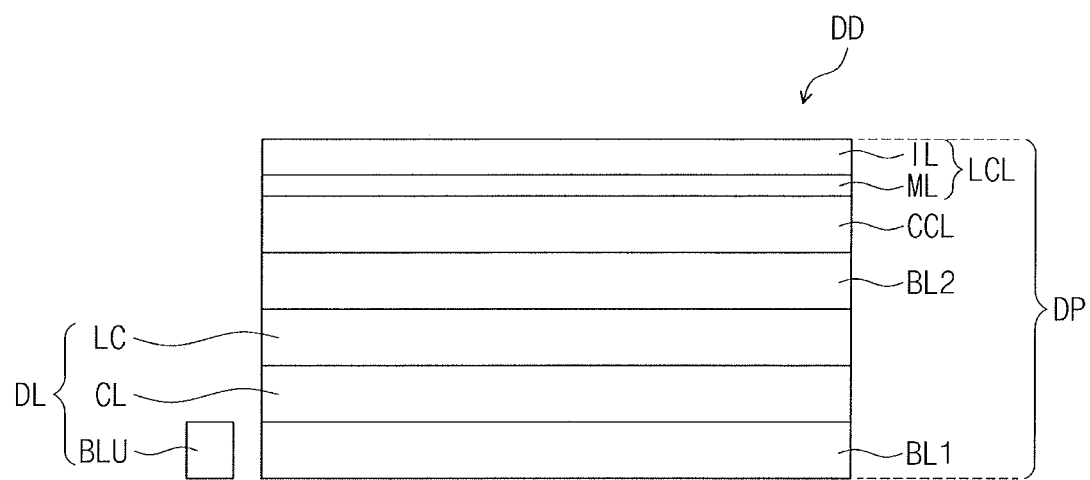

FIG. 15 is a cross-sectional view of a display device according to an embodiment. FIG. 16A is an equivalent circuit diagram of a pixel according to an embodiment. FIG. 16B is a cross-sectional view of a display panel according to an embodiment. FIGS. 17A to 17C are cross-sectional views of a display device according to an embodiment. Hereinafter, a detailed description of the same components as those of the display device described with reference to FIGS. 1 to 14 will be omitted.

According to this embodiment, the display device DD may be a liquid crystal display device. A structure in which the grayscale display layer DL, the color control layer CCL, and the optical control layer LCL described with reference to FIGS. 1 to 6 are applied to the liquid crystal display device will be described in detail with reference to FIGS. 15 to 17C.

As shown in FIG. 15, the display device DD includes a light source BLU and a display panel DP. The light source BLU provides the first color light to the display panel DP. The light source BLU may include a light emitting element and a light guide plate.

The display panel DP includes a first base substrate BL1 and a second base substrate BL2 apart from each other, a liquid crystal layer LC between the first base substrate and the second base substrate, a circuit layer CL, a color control layer CCL, and an optical control layer LCL.

The second base substrate BL2 includes a lower surface adjacent to the liquid crystal layer LC and an upper surface opposed thereto, and an optical control layer LCL and a color control layer CCL may be on the lower surface of the second base substrate BL2. The color control layer CCL may be between the second base substrate BL2 and the liquid crystal layer LC and the optical control layer LCL may be between the second base substrate BL2 and the color control layer CCL. For example, a band filter BF, an absorption layer AL or a low reflective index layer LR may be further disposed on the optical control layer LCL.

As shown in FIG. 10A, when the display device DD further includes a band-gap filter-gap BF and an absorption layer AL, the band-gap filter BF may be disposed between the second base substrate BL2 and the optical control layer LCL, and the absorption layer AL may be between the ban-gap filter BF and the second base substrate BL2. Alternatively, the band-gap filter BF may be between the second base substrate BL2 and the optical control layer LCL, and the absorption layer AL may be on the second base substrate BL2. Alternatively, the band-gap filter BF and the absorption layer AL may be disposed on the upper surface of the second base substrate BL2.

As shown in FIG. 10C, when the display device DD further includes an absorption layer AL and a low reflective index layer LR, the absorption layer AL may be between the second base substrate BL2 and the optical control layer LCL, and the low reflective index layer LR may be between the absorption layer AL and the second base substrate BL2. Alternatively, the absorption layer AL may be between the second base substrate BL2 and the optical control layer LCL, and the low reflective index layer LR may be on the upper surface of the second base substrate BL2. Alternatively, the absorption layer AL and the low reflective index layer LR may be on the upper surface of the second base substrate BL2.

The light source BLU, the circuit layer CL, and the liquid crystal layer LC in the display device DD correspond to the grayscale display layer DL in FIG. 2. Hereinafter, the circuit layer CL and the display panel DP will be described in detail with reference to FIGS. 16A and 16B.

FIG. 16A shows a pixel Px connected to one gate line GL and one data line DAL. The pixel Px may include a thin film transistor T (hereinafter referred to as a transistor), a liquid crystal capacitor Clc, and a storage capacitor Cst. The liquid crystal capacitor Clc may correspond to the display element, and the transistor T and the storage capacitor Cst may be the pixel driver circuit. The number of the transistors T and the storage capacitors Cst may be changed according to the operation mode of the liquid crystal display panel.

The liquid crystal capacitor Clc charges the pixel voltage output from the transistor T. An arrangement of liquid crystal directors included in the liquid crystal layer LC is changed according to a charge amount charged in the liquid crystal capacitor Clc. In other words, the liquid crystal director is controlled by an electric field formed between two electrodes of the liquid crystal capacitor. The light incident to a liquid crystal layer may be transmitted or blocked according to an arrangement of liquid crystal directors.

The storage capacitor Cst is connected in parallel to the liquid crystal capacitor Clc. The storage capacitor Cst maintains an arrangement of liquid crystal directors during a predetermined section.

The liquid crystal capacitor Clc includes a pixel electrode and a common electrode. The storage capacitor Cst includes a pixel electrode and a portion of a storage line STL overlapping the pixel electrode.

FIG. 16B shows a cross section of the display panel DP. The first base substrate BL1 and the second base substrate BL2 may be independently a polymer substrate, a plastic substrate, a glass substrate, a quartz substrate, or the like. The first base substrate BL1 and the second base substrate BL2 may be a transparent insulating substrate. The first base substrate BL1 and the second base substrate BL2 may each be rigid or may each be flexible.

The circuit layer CL is on one side of the first base substrate BL1. The circuit layer CL may include a gate line GL, a storage line STL, and an electrode that forms an electric field in the liquid crystal layer. The gate electrode GE may protrude from the gate lines GGL or may be provided on a partial area of the gate lines GGL.

The transistor T includes a gate electrode GE connected to the gate line GL, an activation part overlapping the gate electrode GE, a source electrode SE connected to the data line DAL, and a drain electrode DE spaced apart from the source electrode.

The semiconductor pattern SM is provided on the gate insulating film GI. The semiconductor pattern SM is provided on the gate electrode GE with the gate insulating film GI therebetween. In the semiconductor pattern SM, a partial area overlaps the gate electrode GE. The semiconductor pattern SM includes an active pattern (not shown) provided on the gate insulating film GI and an ohmic contact layer (not shown) formed on the active pattern. The ohmic contact layer (not shown) makes ohmic contact between the active pattern and the source electrode SE and the drain electrode DE.

The source electrode SE may branch from the data lines DAL. The source electrode SE is formed on the ohmic contact layer, and a partial area overlaps the gate electrode GE. The data line DAL may be in an area where the semiconductor pattern SM is not disposed in the gate insulating film GI.

The drain electrode DE is provided apart from the source electrode SE with the semiconductor pattern SM therebetween. A drain electrode DE is formed on the ohmic contact layer and a partial area overlaps the gate electrode GE.

Thus, the upper surface of the active pattern between the source electrode SE and the drain electrode DE is exposed, and a channel part constituting a conductive channel is formed between the source electrode SE and the drain electrode DE depending on whether a voltage is applied to the gate electrode GE. The source electrode SE and the drain electrode DE overlap a portion of the semiconductor pattern SM in an area excluding the channel part formed apart from the space between the source electrode SE and the drain electrode DE.

The pixel electrode PE is connected to the drain electrode DE with a protective film PSV therebetween. The pixel electrode PE partially overlaps the storage line SLn, the first branch electrode, and the second branch electrode to form a storage capacitor.

The protective film PSV covers the source electrode SE, the drain electrode DE, the channel part, and the gate insulating film GI and has a contact hole CH exposing a portion of the drain electrode DE. The protective film PSV may include, for example, silicon nitride, or silicon oxide.

The pixel electrode PE is connected to the drain electrode DE through the contact hole CH formed in the protective film PSV. The pixel electrode PE is formed of a transparent conductive material.

An optical control layer LCL is on the lower surface of the second base substrate BL2. The color control layer CCL may be below the optical control layer LCL. A common electrode CE may be below the color control layer CCL, e.g., directly on the lower surface of the color control layer CCL. An additional insulating layer may be between the common electrode CE and the color control layer CCL. The common electrode CE controls the liquid crystal layer LC by forming an electric field together with the pixel electrode PE. Alternatively, the common electrode CE may be on the first base substrate BL1.

The liquid crystal layer LC is between the first base substrate BL1 and the second base substrate BL2, and includes a plurality of liquid crystal molecules. The liquid crystal layer LC may be provided by arranging liquid crystal molecules having a dielectric anisotropy. The liquid crystal layer LC may be any commonly used liquid crystal molecule. For example, as the liquid crystal molecule, an alkenyl-based liquid crystal compound or an alkoxy-based liquid crystal compound may be used. The liquid crystal molecules used in the embodiments may have negative dielectric anisotropy or a positive dielectric constant anisotropy.

One or more insulating layers IS may be on one surface of the first base substrate BL1 or the second base substrate BL2. An alignment film may be between the first base substrate BL1 and the liquid crystal layer LC or between the second base substrate BL2 and the liquid crystal layer LC. The alignment film can control the alignment angle of the liquid crystal injected to the liquid crystal layer LC. In addition, the first base substrate BL1 and the second base substrate BL2 of the display device may be turned over, e.g., flipped.

Although the liquid crystal display panel of the Vertical Alignment (VA) mode is exemplarily described in this embodiment, in one embodiment, the liquid crystal display panel of the in-plane switching (IPS) mode, the fringe-field switching (FFS) mode, the planar to linear switching (PLS) mode, the super vertical alignment (SVA) mode, a Surface-Stabilized Vertical Alignment (SS-VA) mode, and the like may be applied.

FIGS. 17A to 17C are cross-sectional views illustrating a laminated structure of a display device according to an embodiment. FIGS. 17A to 17C show brief circuit layers CL in comparison with FIG. 16B. Hereinafter, a detailed description of the same components as those of the display device described with reference to FIGS. 1 to 16B will be omitted.

As shown in FIG. 17A, the color control layer CCL and the optical control layer LCL may be on the upper surface of the second base substrate BL2. Additional layers may be on the upper surface of the second base substrate BL2. For example, a band-gap filter BF, an absorption layer AL, and/or a low reflective index layer LR may be on the optical control layer LCL.

As shown in FIGS. 17B and 17C, the light source BLU includes a light emitting device, and may not include a light guide plate. The first base substrate BL1 serves as a light guide plate. The light emitting element provides light to the side of the first base substrate BL1.

The display device shown in FIG. 17B is different only in the configuration of the display device and the light source BLU shown in FIG. 15, and other configurations may be applied equally. The display device shown in FIG. 17C is different only in the configuration of the display device and the light source BLU shown in FIG. 16A, and other configurations may be applied equally.

The light source BLU may further include at least one optical sheet for collecting and supplying light to the liquid crystal layer LC. The optical sheet may be a light collecting sheet for collecting and supplying the light generated by the light emitting elements in the front direction of the liquid crystal layer LC. For example, the optical sheet may be a light collecting sheet having a prism pattern.

By way of summation and review, one or more embodiments may provide a display device having improved light efficiency and/or reduced external light reflection. One or embodiments includes an optical control layer including a metal layer disposed on a color control layer, thereby providing a display device that improves light efficiency by utilizing internal reflection. One or more embodiments may include an optical control layer including an inorganic layer on a color control layer, thereby providing a display device with reduced external light reflectance utilizing destructive interference. One or more embodiments may include an absorption layer disposed on an optical control layer to provide a display device with a reduced external light reflectance. One or more embodiments may include a bandgap filter disposed on an optical control layer, thereby providing a display device with improved display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display layer to provide a first color light;
a color control layer on the display layer and including a transmission filter for transmitting the first color light and a color conversion filter for converting the first color light to another color light; and
an optical control layer on the color control layer and including a metal layer having an absorption coefficient of 3 or more and 3.5 or less in a wavelength range of 530 nm to 570 nm and a first inorganic sub-layer having an absorption coefficient of 0.3 or more and 1 or less in a wavelength range of 530 nm to 570 nm.

2. The display device as claimed in claim 1, wherein the first inorganic sub-layer satisfies Equation 1 below;

$$2Ta = \left(m + \frac{1}{2}\right) \times \frac{2\lambda}{(n_1 + n_2)} \quad \text{[Equation 2]}$$

wherein in Equation 1, $\lambda$ is a wavelength of 530 nm to 570 nm, m is 0 or a natural number, Ta is a thickness of the first inorganic sub-layer, and $n_1$ is a refractive index of the first inorganic sub-layer at $\lambda$.

3. The display device as claimed in claim 2, wherein a thickness of the first inorganic sub-layer is 10 nm or more and 40 nm or less.

4. The display device as claimed in claim 2, wherein a refractive index of the first inorganic sub-layer is 2 or more and 2.5 or less.

5. The display device as claimed in claim 1, wherein the first inorganic sub-layer includes molybdenum tantalum oxide.

6. The display device as claimed in claim 1, further comprising a second inorganic sub-layer having an absorption coefficient of 0.001 or more and 0.2 or less in a wavelength range of 530 nm to 570 nm.

7. The display device as claimed in claim 6, wherein an inorganic layer including the first inorganic sub-layer and the second inorganic sub-layer satisfies the following Equation 2;

$$2Ta = (m + 1/2) \times 2\lambda / (n1 + n2) \quad \text{[Equation 2]}$$

wherein in the above Equation 2, $\lambda$ is a wavelength of 530 nm to 570 nm, m is 0 or a natural number, Ta is a thickness of the inorganic layer IL, $n_1$ is a refractive index of the first inorganic sub-layer Sub-IL1 at the $\lambda$ wavelength, and 112 is a refractive index of the second inorganic sub-layer Sub-IL2 at the $\lambda$ wavelength.

8. The display device as claimed in claim 6, wherein a difference between a refractive index of the first inorganic sub-layer and a refractive index of the second inorganic sub-layer is 0 or more and 0.5 or less.

9. The display device as claimed in claim 6, wherein a refractive index of the second inorganic sub-layer is 2 or more and 2.5 or less.

10. The display device as claimed in claim 6, wherein a thickness of the first inorganic sub-layer is 9.9 nm or more and 39.9 nm or less, and a thickness of the second inorganic sub-layer is 0.1 nm or more and 20.0 nm or less.

11. The display device as claimed in claim 6, wherein the second inorganic sub-layer includes indium zinc oxide.

12. The display device as claimed in claim 6, wherein the second inorganic sub-layer is between the metal layer and the first inorganic sub-layer.

13. The display device as claimed in claim 6, wherein the second inorganic sub-layer is on the metal layer and the first inorganic sub-layer.

14. The display device as claimed in claim 1, wherein the metal layer has a thickness of 5 nm or more and 20 nm or less.

15. The display device as claimed in claim 1, wherein the metal layer includes silver.

16. The display device as claimed in claim 1, wherein the color conversion filter includes at least a quantum dot or a quantum rod.

17. The display device as claimed in claim 1, wherein:
the display layer includes a first pixel corresponding to the transmission filter, a second pixel corresponding to the color conversion filter, and a third pixel,
the color conversion filter includes a first color conversion filter corresponding to the second pixel and for converting the first color light to a second color light and a second color conversion filter corresponding to the third pixel and for converting the first color light to a third color light, and the optical control layer overlaps the first pixel, the second pixel, and the third pixel.

18. The display device as claimed in claim 17, wherein the first color light has a wavelength of 410 run to 480 nm, the second color light has a wavelength of 500 nm to 570 nm, and the third color light has a wavelength of 625 nm to 675 nm.

19. The display device as claimed in claim 17, further comprising a band-gap filter on the color control layer, overlapping the second pixel and the third pixel, for blocking the first color light, and for transmitting the second color light and the third color light.

20. The display device as claimed in claim 19, wherein the band-gap filter includes a first dye that absorbs light at a wavelength in a range of at least 440 nm to 460 nm.

21. The display device as claimed in claim 20, wherein the band-gap filter further includes a second dye that absorbs light at a wavelength in a range of at least 580 nm to 600 nm.

22. The display device as claimed in claim 17, wherein:
the first pixel, the second pixel, and the third pixel includes a first organic light emitting diode, a second organic light emitting diode, and a third organic light emitting diode, respectively, and
light emitting layers of the first organic light emitting diode, the second organic light emitting diode, and the third organic light emitting diode are integral.

23. The display device as claimed in claim 1, further comprising an absorption layer on the optical control layer and for absorbing light having a wavelength in a range of at least 580 nm to 600 nm.

24. The display device as claimed in claim 1, further comprising a low reflective index layer on the optical control layer and having a refractive index of 1.1 or more and 1.5 or less.

25. A display device, comprising:
a base substrate;
first to third pixels on the base substrate and each including an organic light emitting diode for generating a first color light;
a sealing member to seal the first to third pixels;
a color control layer including a transmission filter corresponding to the first pixel and for transmitting the first color light, a first color conversion filter corresponding to the second pixel and for converting the first color light to a second color light, and a second color conversion filter corresponding to the third pixel and for converting the first color light to a third color light and on the first to third pixels; and
an optical control layer including a metal layer having an absorption coefficient of 3 or more and 3.5 or less in a wavelength range of 530 nm to 570 nm and an inorganic layer containing a first inorganic sub-layer having an absorption coefficient of 0.3 or more and 1 or less in the wavelength range of 530 nm to 570 nm, on the color control layer, and overlapping the first to third pixels.

26. The display device as claimed in claim 25, wherein the inorganic layer further includes a second inorganic sub-layer having an absorption coefficient of 0.001 or more and 0.2 or less in a wavelength range of 530 nm to 570 nm.

27. The display device as claimed in claim 25, wherein:
the sealing member includes a thin film sealing layer including at least one inorganic film, and
the color control layer is on the thin film sealing layer.

28. The display device as claimed in claim 25, wherein:
the sealing member includes an encapsulation substrate spaced apart from the first to third pixels, and
the color control layer and the optical control layer are on an upper surface or a lower surface of the encapsulation substrate.

* * * * *

UNITED STATES PATENT AND TRADEMARK OFFICE
CERTIFICATE OF CORRECTION

PATENT NO. : 11,016,325 B2
APPLICATION NO. : 16/356197
DATED : May 25, 2021
INVENTOR(S) : Ohjeong Kwon et al.

Page 1 of 1

It is certified that error appears in the above-identified patent and that said Letters Patent is hereby corrected as shown below:

In the Claims

Column 23, Line 63, Claim 2    Delete "$(n_1+n_2)$",
Insert --$n_1$--

Column 23, Line 63, Claim 2    Delete "[Equation 2]",
Insert --[Equation 1]--

Column 25, Line 4, Claim 18    Delete "run",
Insert --nm--

Signed and Sealed this
Seventeenth Day of May, 2022

Katherine Kelly Vidal
*Director of the United States Patent and Trademark Office*